US009666769B2

(12) United States Patent
Osaki et al.

(10) Patent No.: US 9,666,769 B2
(45) Date of Patent: May 30, 2017

(54) LIGHT EMITTING DEVICE, LED LIGHT SOURCE FOR PLANT CULTIVATION, AND PLANT FACTORY

(75) Inventors: Shinji Osaki, Osaka (JP); Toyonori Uemura, Osaka (JP); Toshio Hata, Osaka (JP); Tomokazu Nada, Osaka (JP); Tatsuya Morioka, Osaka (JP); Makoto Matsuda, Osaka (JP); Shinya Ishizaki, Osaka (JP); Makoto Agatani, Osaka (JP); Hitoshi Matsushita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/988,405

(22) PCT Filed: Nov. 15, 2011

(86) PCT No.: PCT/JP2011/076322
§ 371 (c)(1),
(2), (4) Date: May 20, 2013

(87) PCT Pub. No.: WO2012/070435
PCT Pub. Date: May 31, 2012

(65) Prior Publication Data
US 2013/0264934 A1    Oct. 10, 2013

(30) Foreign Application Priority Data

Nov. 25, 2010  (JP) ................................. 2010-263000
Jul. 21, 2011   (JP) ................................. 2011-160255
(Continued)

(51) Int. Cl.
*H01J 1/62*      (2006.01)
*H01J 63/04*     (2006.01)
(Continued)

(52) U.S. Cl.
CPC ............ *H01L 33/504* (2013.01); *A01G 7/045* (2013.01); *H01L 25/0753* (2013.01);
(Continued)

(58) Field of Classification Search
CPC ......... H05B 33/10; H05B 33/12; H01L 33/56; H01L 33/55; H01L 33/26; H01L 33/32;
(Continued)

(56) References Cited

U.S. PATENT DOCUMENTS 4,914,858  A       4/1990  Nijssen et al.
2002/0163302 A1 * 11/2002  Nitta et al. .................... 313/512
(Continued)

FOREIGN PATENT DOCUMENTS

CA   WO 2010066042 A1 *  6/2010  ............ A01G 7/045
CN         101717632      6/2010
(Continued)

OTHER PUBLICATIONS

International Search Report for PCT/JP2011/076322 mailed Dec. 13, 2011.
(Continued)

*Primary Examiner* — Anh Mai
*Assistant Examiner* — Glenn Zimmerman
(74) *Attorney, Agent, or Firm* — Nixon & Vanderyhe P.C.

(57) ABSTRACT

A substrate-type LED light source (10) includes: at least one blue LED chip (2) which has an emission peak in a range from 400 nm to 480 nm so as to correspond to a blue light region absorption peak of chlorophyll; a red phosphor (7b) which emit, upon receiving excitation light from the at least one blue LED chip (2), light having a peak wavelength in a range from 620 nm to 700 nm so as to correspond to a red light region absorption peak of chlorophyll; and a resin layer
(Continued)

(7) in which the red phosphor 7b is dispersed and which covers the at least one blue LED chip (2).

11 Claims, 12 Drawing Sheets

(30) Foreign Application Priority Data

Oct. 14, 2011 (JP) ................................. 2011-227260
Oct. 18, 2011 (JP) ................................. 2011-229239

(51) Int. Cl.
*H01L 33/50* (2010.01)
*A01G 7/04* (2006.01)
*H01L 25/075* (2006.01)
*H05B 33/12* (2006.01)

(52) U.S. Cl.
CPC ............ *H05B 33/12* (2013.01); *H01L 33/502* (2013.01); *H01L 2224/48091* (2013.01); *H01L 2224/48247* (2013.01); *H01L 2224/48257* (2013.01); *Y02P 60/149* (2015.11)

(58) Field of Classification Search
CPC ....... H01L 33/64; H01L 33/50; H01L 33/504; H01L 25/0753; H01L 33/502; H01L 2224/48091; H01L 2224/48247; H01L 2224/48257; A01G 7/045; F21K 9/00; F21Y 2101/02; Y02P 60/149
USPC ............. 257/98, 99, 100, E33.059, E21.502; 313/46, 502; 438/26; 47/58.1 LS; 362/230

See application file for complete search history.

(56) References Cited

U.S. PATENT DOCUMENTS

| | | |
|---|---|---|
| 2006/0152140 A1 | 7/2006 | Brandes |
| 2007/0114562 A1* | 5/2007 | Radkov et al. ............... 257/103 |
| 2007/0223219 A1 | 9/2007 | Medendorp, Jr. et al. |
| 2008/0017872 A1* | 1/2008 | Kim .................... H01L 25/0753 257/89 |
| 2008/0180948 A1 | 7/2008 | Yoon et al. |
| 2009/0008663 A1* | 1/2009 | Shimizu et al. ................ 257/98 |
| 2009/0008673 A1* | 1/2009 | Kato et al. .................... 257/100 |
| 2009/0050907 A1 | 2/2009 | Yuan et al. |
| 2009/0050908 A1 | 2/2009 | Yuan et al. |
| 2009/0050925 A1* | 2/2009 | Kuramoto et al. ........... 257/100 |
| 2009/0108281 A1 | 4/2009 | Keller et al. |
| 2009/0195137 A1 | 8/2009 | Brandes |
| 2010/0200874 A1* | 8/2010 | Shioi et al. ...................... 257/91 |
| 2010/0252851 A1 | 10/2010 | Emerson et al. |
| 2010/0320483 A1* | 12/2010 | Kadotani .................. F21K 9/00 257/88 |
| 2011/0012143 A1 | 1/2011 | Yuan et al. |
| 2011/0050125 A1 | 3/2011 | Medendorp, Jr. et al. |
| 2012/0032208 A1 | 2/2012 | Brandes |
| 2012/0054061 A1* | 3/2012 | Fok et al. ..................... 705/26.5 |
| 2012/0099305 A1* | 4/2012 | Bucove ........................ 362/231 |
| 2012/0124903 A1* | 5/2012 | Takeuchi ................. 47/58.1 LS |
| 2012/0140436 A1* | 6/2012 | Yang et al. .................... 362/84 |
| 2012/0153322 A1* | 6/2012 | Posselt ...................... F21K 9/00 257/91 |
| 2012/0187862 A1 | 7/2012 | Britt et al. |
| 2012/0241781 A1 | 9/2012 | Yuan et al. |
| 2013/0255150 A1* | 10/2013 | Karpinski et al. ........ 47/58.1 LS |

FOREIGN PATENT DOCUMENTS

| | | |
|---|---|---|
| CN | 101834266 | 9/2010 |
| JP | 01-101824 | 4/1989 |
| JP | 09-252651 | 9/1997 |
| JP | 11-266704 | 10/1999 |
| JP | 2002-027831 | 1/2002 |
| JP | 2002-299694 | 10/2002 |
| JP | 2002-315569 | 10/2002 |
| JP | 2004-344114 | 12/2004 |
| JP | 2006-50988 | 2/2006 |
| JP | 2008-131909 | 6/2008 |
| JP | 2008-154541 A | 7/2008 |
| JP | 2008-527708 | 7/2008 |
| JP | 2008-181771 | 8/2008 |
| JP | 2008-212078 | 9/2008 |
| JP | 2008-282932 | 11/2008 |
| JP | 2009-261267 | 11/2009 |
| JP | 2010-004869 | 1/2010 |
| JP | 2010-130986 | 6/2010 |
| JP | 2010-140644 | 6/2010 |
| JP | 2011-155948 A | 8/2011 |
| WO | WO 2007135707 A1 * | 11/2007 |
| WO | WO 2009/022016 | 2/2009 |
| WO | WO 2009031495 A1 * | 3/2009 |
| WO | WO 2010111010 A1 * | 9/2010 ............... F21K 9/00 |
| WO | WO 2011016521 A1 * | 2/2011 |
| WO | WO 2011154522 A1 * | 12/2011 |

OTHER PUBLICATIONS

Written Opinion of the International Searching Authority mailed Dec. 13, 2011.
Japanese Office Action for JP Application No. 2013-267558 issued Nov. 10, 2015.
Japanese Office Action for JP 2015-104773 issued on Apr. 19, 2016.

* cited by examiner

LIGHT EMITTING DEVICE, LED LIGHT SOURCE FOR PLANT CULTIVATION, AND PLANT FACTORY

This application is the U.S. national phase of International Application No. PCT/JP2011/076322 filed 15 Nov. 2011 which designated the U.S. and claims priority to JP 2010-263000 filed 25 Nov. 2010, JP 2011-160255 filed 21 Jul. 2011, JP 2011-227260 filed 14 Oct. 2011, and JP 2011-229239 filed 18 Oct. 2011, the entire contents of each of which are hereby incorporated by reference.

TECHNICAL FIELD

The present invention relates to a light emitting device for emitting light to be absorbed by plants or algae which require the light for photosynthesis to grow, and an LED light source for plant cultivation and a plant factory. Specifically, the present invention relates to a light emitting device for efficiently cultivating organisms such as plants and algae, and an LED light source for plant cultivation and a plant factory.

BACKGROUND ART

One example of a conventional LED light source for plant cultivation which can be used in plant factories etc. is a plant elongating apparatus disclosed in Patent Literature 1.

As shown in FIG. 11, a plant elongating apparatus 100 disclosed in Patent Literature 1 includes (i) a light emitting section 110 for emitting light for elongating plants, (ii) a power supply section 120 for supplying electricity to the light emitting section 110 such that a spectrum of light to be emitted is changeable, (iii) a determination section 131 for determining the type of a plant 101 to be cultivated, and (iv) a light spectrum setting section 132 for setting the spectrum of light by controlling the power supply section 120 according to the type of the plant 101 determined by the determination section 131.

The light emitting section 110 is (i) constituted by a large number of LEDs 112 arranged on one surface of a flat substrate 111, which LEDs 112 are of a plurality of types that emit light of different spectra, and (ii) arranged such that light emitted from the LEDs 112 is directed to the plant 101. Each of the LEDs 112 has a shape of a bullet, for example.

Another example of a conventional LED light source for plant cultivation is an LED light source for plant cultivation which is disclosed in Patent Literature 2.

An LED light source 200 for plant cultivation disclosed in Patent Literature 2 can be attached to a cover of a plant cultivation container, and is constituted by, as shown in FIG. 12, (i) a cathode terminal 201, (ii) an anode terminal 202, (iii) a light emitting chip 203, and (iv) an epoxy resin lens 204. The LED light source 200 for plant cultivation emits light 205 that has a color corresponding to the type of the light emitting chip 203.

CITATION LIST

Patent Literatures

Patent Literature 1
Japanese Patent Application Publication, Tokukai No. 2004-344114 A (Publication Date: Dec. 9, 2004)

Patent Literature 2
Japanese Patent Application Publication, Tokukaihei No. 9-252651 A (1997) (Publication Date: Sep. 30, 1997)

SUMMARY OF INVENTION

Technical Problem

However, as shown in FIG. 2 of Patent Literature 2, a red LED for use in the conventional LED light source 200 for plant cultivation disclosed in Patent Literature 2 (shown in FIG. 12) has a wavelength range of 630 nm to 680 nm and preferably has an emission peak wavelength of about 660 nm. Further, a blue LED for use in the conventional LED light source 200 for plant cultivation has a wavelength range of 380 nm to 480 nm and preferably has an emission peak wavelength of about 450 nm.

In Patent Literature 2, the amount of light from blue LEDs is controlled so as not to exceed 50% of the amount of light from red LEDs. In general, red LEDs and blue LEDs are used in combination; however, depending on the type of a plant, it is possible to only use red LEDs.

However, in the case where red LEDs and blue LEDs are used in combination or in the case where only red LEDs are used, the following problems will arise.

(1) It is difficult to arrange red LEDs and blue LEDs when these are to be used in combination. Specifically, the red LEDs and the blue LEDs occupy a very large area. Further, it is difficult to regularly arrange these LEDs in a corner.

(2) The proportions of light in a blue light region and light in a red light region need to be controlled. In this regard, if the proportions of light are controlled by changing the number of blue LEDs or the number of red LEDs, the proportions will deviate from desired proportions when the LEDs are used for a long time, due to a difference between the deterioration characteristics of the blue LEDs and the red LEDs.

Further, in order to cause the amount of light from the blue LEDs not to exceed 50% of the amount of light from the red LEDs, the following steps:

(A) causing the red LEDs to emit bright light (increasing a drive current);

(B) increasing the number of LED chips to be provided to each of the red LEDs;

(C) increasing the number of red LEDs;

and/or the like are required.

However, in a case of the above (A), the deterioration characteristics of the blue LED chips and the red LED chips become more different, and thus the proportions of light will deviate from the desired proportions to a greater extent when the LED chips are used for a long time. Further, since the amounts of light are to be controlled electrically, an electrical drive circuit etc. are required and thus a configuration becomes complicated. In a case of the above (B), each of the red LEDs becomes large in size, and thus it becomes difficult to control wide-angle directional characteristics, for example. In a case of the above (C), the number of blue LEDs is relatively small, and therefore, even if the blue LEDs are equally spaced or have wide-angle directional characteristics, red light and blue light may not be thoroughly mixed and thus color unevenness may be likely to occur.

(3) It is difficult to mix light from the blue LEDs and light from the red LEDs, and thus difficult to obtain a mixed color which is necessary for plant cultivation. Specifically, in a case where a plurality of individual blue LEDs and red LEDs are used, it is very difficult to satisfy predetermined proportions of light and simultaneously realize light of a uniformly mixed color without spatial unevenness.

The present invention has been made in view of the above conventional problems, and an object of the present invention is to provide a light emitting device capable of easily controlling the proportions of light in a blue light region and light in a red light region despite only having a simple configuration and occupying a small area, and an LED light source for plant cultivation and a plant factory.

Solution to Problem

In order to attain the above object, a light emitting device of the present invention includes: at least one first LED chip which emits first short-wavelength-region light corresponding to a first peak wavelength, which is in a relatively short wavelength region, of a plurality of peak wavelengths of light absorbed by a plant or an alga which requires the light for photosynthesis to grow; and a phosphor-containing sealing resin which covers said at least one first LED chip, a phosphor contained in the phosphor-containing sealing resin emitting long-wavelength-region light upon absorbing the first short-wavelength-region light emitted from said at least one first LED chip, the long-wavelength-region light corresponding to a peak wavelength, which is in a longer wavelength region than the first peak wavelength, of the plurality of peak wavelength.

Specifically, in many cases, photosynthetic organisms such as plants and algae require, for their growth, light having (i) a first peak wavelength in a relatively short wavelength region and (ii) a peak wavelength in a longer wavelength region than the first peak wavelength. In view of the circumstances, the light emitting device of the present invention includes (a) the at least one first LED chip which emits the first short-wavelength-region light corresponding to the first peak wavelength and (b) the phosphor-containing sealing resin which covers the at least one first LED chip. The phosphor contained in the phosphor-containing sealing resin emits the long-wavelength-region light corresponding to the peak wavelength in the longer wavelength region than the first peak wavelength.

As a result, the light emitting device does not require the use of two types of LED chips (separately provided blue LED chip and red LED chip) to emit light corresponding to a blue light region absorption peak and a red light region absorption peak of chlorophyll etc. which light is necessary for the growth of organisms such as plants and algae, and is capable of emitting such light with use of only one type of LED chip (blue LED chip). Therefore, the light emitting device does not occupy a large area. Moreover, in this configuration, since the red phosphor is to be dispersed in the resin layer, it is possible to disperse the red phosphor in the resin at a predetermined blending ratio. By changing the blending ratio, it is possible to change the amount of light in the blue light region and the amount of light in the red light region.

Accordingly, it is possible to provide a light emitting device capable of, despite only having a simple configuration and occupying a small area, (i) easily adjusting the proportions of light in the blue light region and light in the red light region and (ii) emitting blue light and red light mixed with little spatial color unevenness.

The light emitting device of the present invention can further include at least one second LED chip which emits second short-wavelength-region light corresponding to a second peak wavelength, which is in the relatively short wavelength region but is a different wavelength from the first peak wavelength, of the plurality of peak wavelengths.

This makes it possible to provide a light emitting device which appropriately stimulates the growth of organisms such as plants and algae even in a case where there are the following two peak wavelengths in the relatively short wavelength region: the first peak wavelength and the second peak wavelength.

In order to attain the above object, an LED light source for plant cultivation in accordance with the present invention, including the foregoing light emitting device, includes: at least one blue LED chip having an emission peak in a range from 400 nm to 480 nm so as to correspond to a blue light region absorption peak of chlorophyll; a red phosphor which emits, upon receiving excitation light from said at least one blue LED chip, light having a peak wavelength in a range from 620 nm to 700 nm so as to correspond to a red light region absorption peak of chlorophyll; and a resin layer in which the red phosphor is dispersed and which covers said at least one blue LED chip.

According to the configuration, the LED light source for plant cultivation includes (i) the at least one blue LED chip and (ii) the resin layer in which the red phosphor is dispersed and which covers the at least one blue LED chip. In this configuration, the at least one blue LED chip is capable of emitting light having a wavelength of 400 nm to 480 nm so as to correspond to the blue light region absorption peak of chlorophyll. The red phosphor emits, upon receiving the excitation light from the at least one blue LED chip, light having a peak wavelength in a range from 620 nm to 700 nm so as to correspond to the red light region absorption peak of chlorophyll.

As a result, the LED light source for plant cultivation does not require the use of two types of LED chips (separately provided blue LED chip and red LED chip) to emit light corresponding to the blue light region absorption peak and the red light region absorption peak of chlorophyll which light is necessary for the growth of plants, and is capable of emitting such light with use of only one type of LED chip (blue LED chip). Therefore, the LED light source for plant cultivation does not occupy a large area. Moreover, in this configuration, since the red phosphor is to be dispersed in the resin layer, it is possible to disperse the red phosphor in the resin at a predetermined blending ratio. By changing the blending ratio, it is possible to change the amount of light in the blue light region and the amount of light in the red light region.

Accordingly, it is possible to provide an LED light source for plant cultivation capable of, despite only having a simple configuration and occupying a small area, (i) easily adjusting the proportions of light in the blue light region and light in the red light region and (ii) emitting blue light and red light mixed with little spatial color unevenness.

In order to attain the above object, a plant factory in accordance with the present invention includes the foregoing LED light source for plant cultivation.

The configuration makes it possible to provide a plant factory including an LED light source for plant cultivation capable of, despite only having a simple configuration and occupying a small area, easily adjusting the proportions of light in the blue light region and light in the red light region.

Advantageous Effects of Invention

As has been described, a light emitting device of the present invention includes: at least one first LED chip which emits first short-wavelength-region light corresponding to a first peak wavelength, which is in a relatively short wavelength region, of a plurality of peak wavelengths of light absorbed by a plant or an alga which requires the light for photosynthesis to grow; and a phosphor-containing sealing resin which covers said at least one first LED chip, a phosphor contained in the phosphor-containing sealing resin emitting long-wavelength-region light upon absorbing the first short-wavelength-region light emitted from said at least one first LED chip, the long-wavelength-region light corresponding to a peak wavelength, which is in a longer wavelength region than the first peak wavelength, of the plurality of peak wavelengths.

As has been described, an LED light source for plant cultivation in accordance with the present invention includes: at least one blue LED chip having an emission peak in a range from 400 nm to 480 nm so as to correspond to a blue light region absorption peak of chlorophyll; a red phosphor which emits, upon receiving excitation light from said at least one blue LED chip, light having a peak wavelength in a range from 620 nm to 700 nm so as to correspond to a red light region absorption peak of chlorophyll; and a resin layer in which the red phosphor is dispersed and which covers said at least one blue LED chip.

As has been described, a plant factory of the present invention includes the LED light source for plant cultivation.

Accordingly, it is possible to provide a light emitting device capable of, despite having only a simple configuration and occupying a small area, easily adjusting the proportions of light in the blue light region and light in the red light region, an LED light source for plant cultivation and a plant factory.

BRIEF DESCRIPTION OF DRAWINGS (a) and (b) of FIG. 1 illustrate one embodiment of an LED light source for plant cultivation of the present invention. (a) and (b) of FIG. 1 are each a cross-sectional view showing a configuration of a substrate-type LED light source for plant cultivation.

(a) of FIG. 2 is a plan view showing a configuration of the substrate-type LED light source for plant cultivation before a resin layer is formed. (b) of FIG. 2 is a plan view showing a configuration of the substrate-type LED light source for plant cultivation after the resin layer is formed.

(a) of FIG. 3 is a graph showing an emission spectrum of the LED light source for plant cultivation, observed in a case where a blending ratio of a red phosphor to a resin is 0.05:1. (b) of FIG. 3 is a graph showing an emission spectrum of the LED light source for plant cultivation, observed in a case where a blending ratio of a red phosphor to a resin is 0.10:1.

(a) of FIG. 4 is a graph showing an emission spectrum of the LED light source for plant cultivation, observed in a case where a blending ratio of a red phosphor to a resin is 0.15:1. (b) of FIG. 4 is a graph showing an emission spectrum of the LED light source for plant cultivation, observed in a case where a blending ratio of a red phosphor to a resin is 0.20 to 1.

Figure 7:
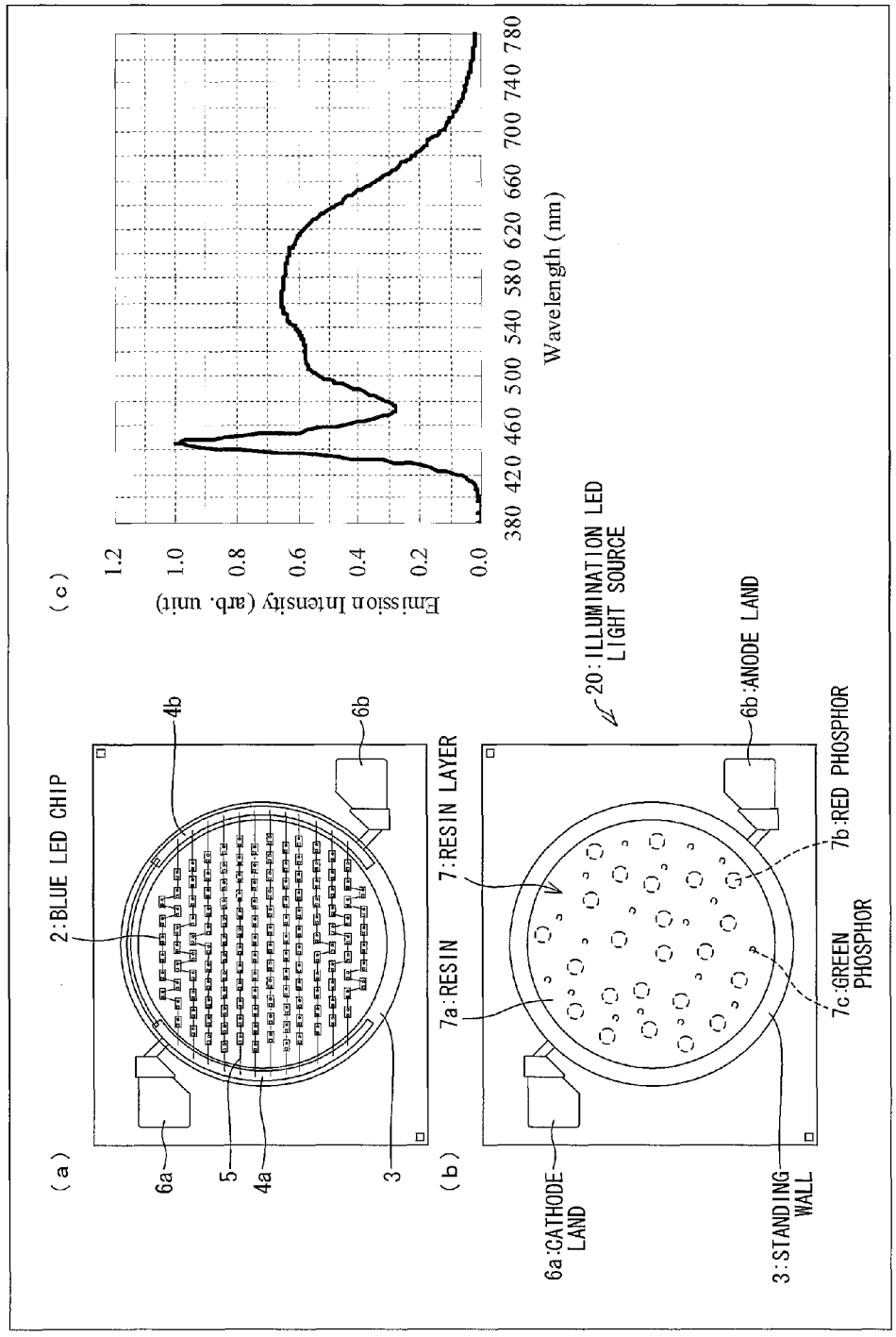

(a) and (b) of FIG. 7 are plan views each showing a configuration of an LED light source for plant cultivation to be applied for illumination. (c) is a graph showing an emission spectrum of the LED light source for plant cultivation.

Figure 8:
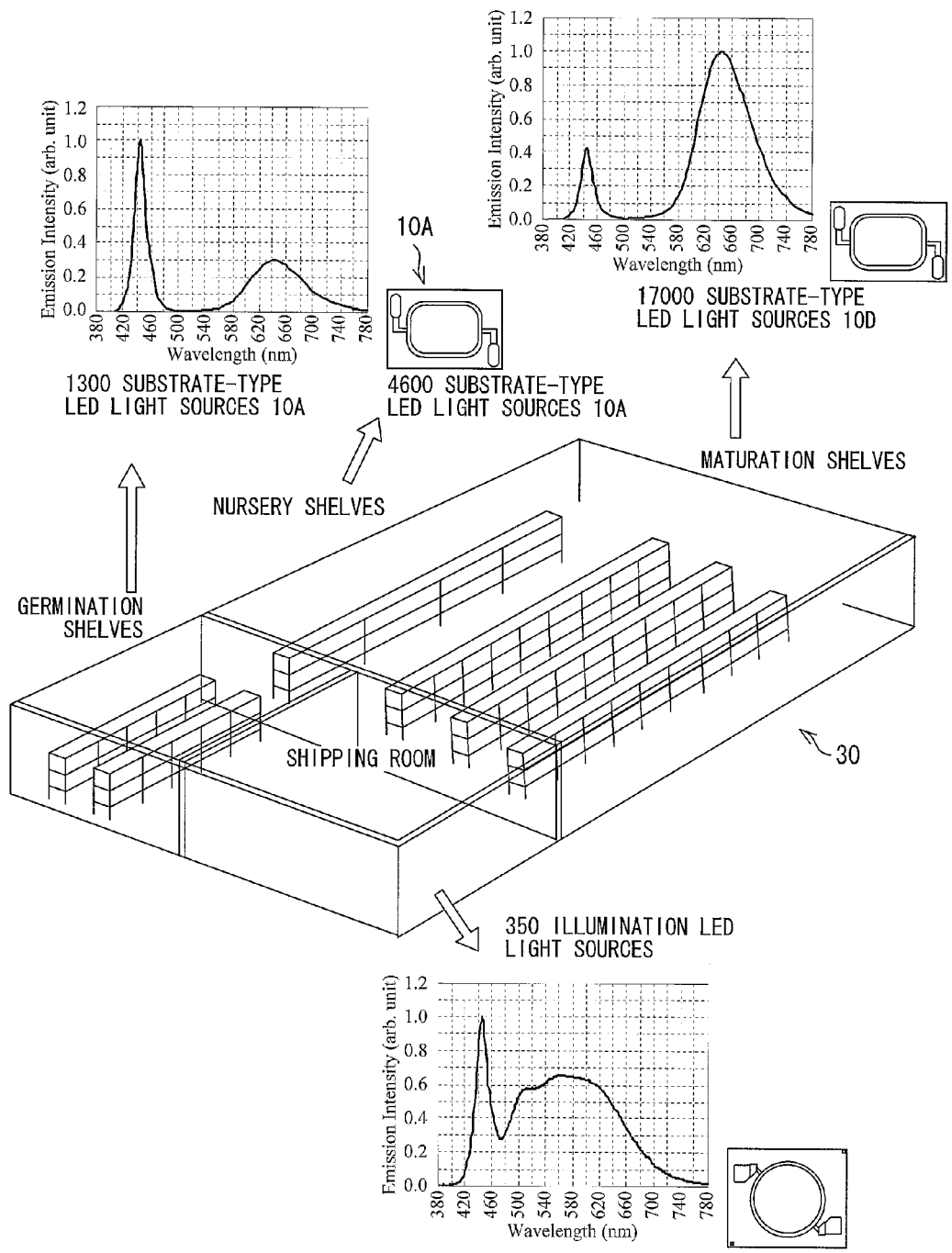

FIG. 8 is an explanatory view illustrating an example of application of the LED light source for plant cultivation to a plant factory.

Figure 9:
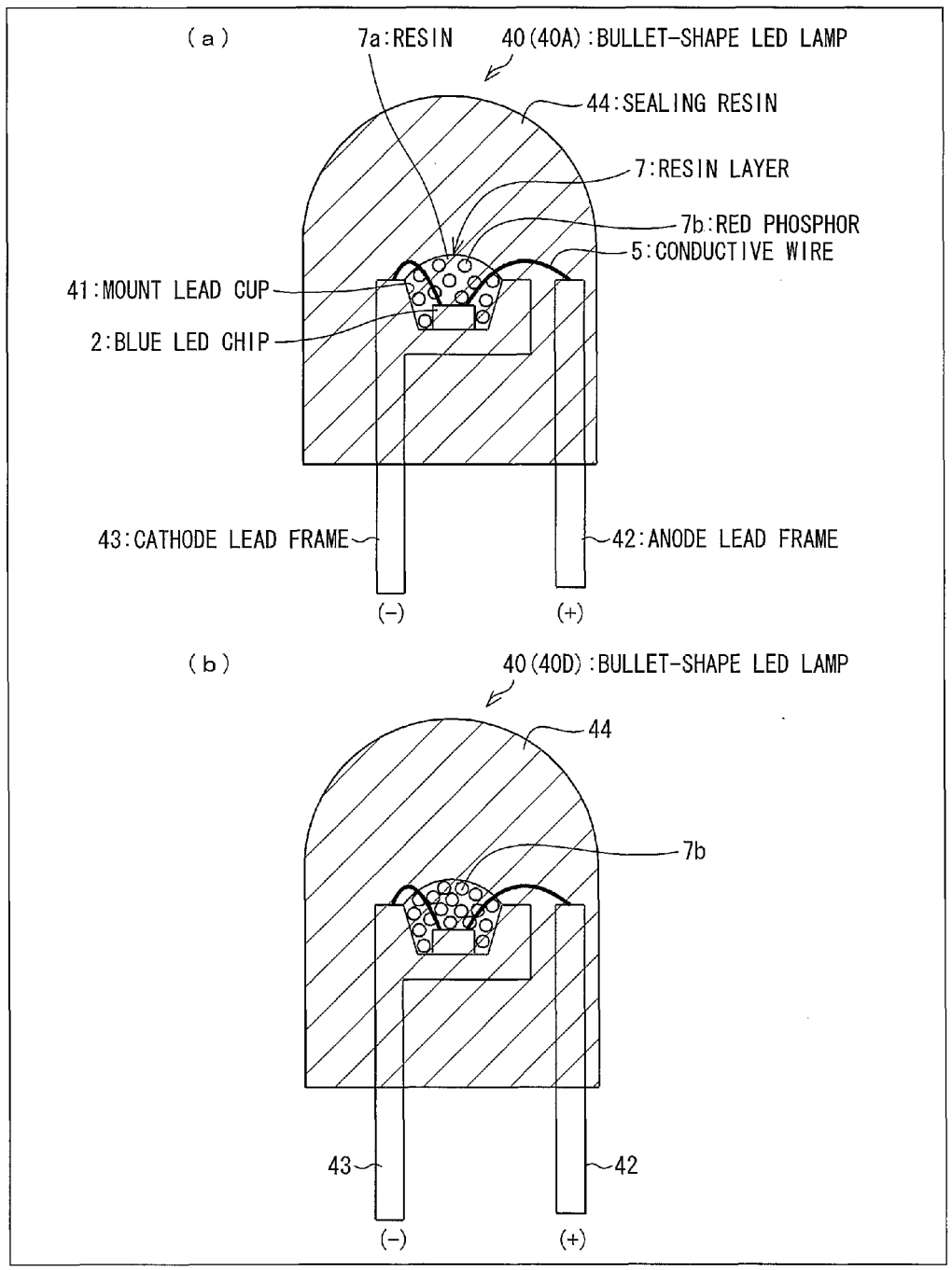

(a) of FIG. 9 is a cross-sectional view showing a configuration of a bullet-shape LED light source for plant cultivation, observed in a case where a blending ratio of a red phosphor to a resin is 0.05:1. (b) of FIG. 9 is a cross-sectional view showing a configuration of a bullet-shape LED light source for plant cultivation, observed in a case where a blending ratio of a red phosphor to a resin is 0.20:1.

Figure 10:
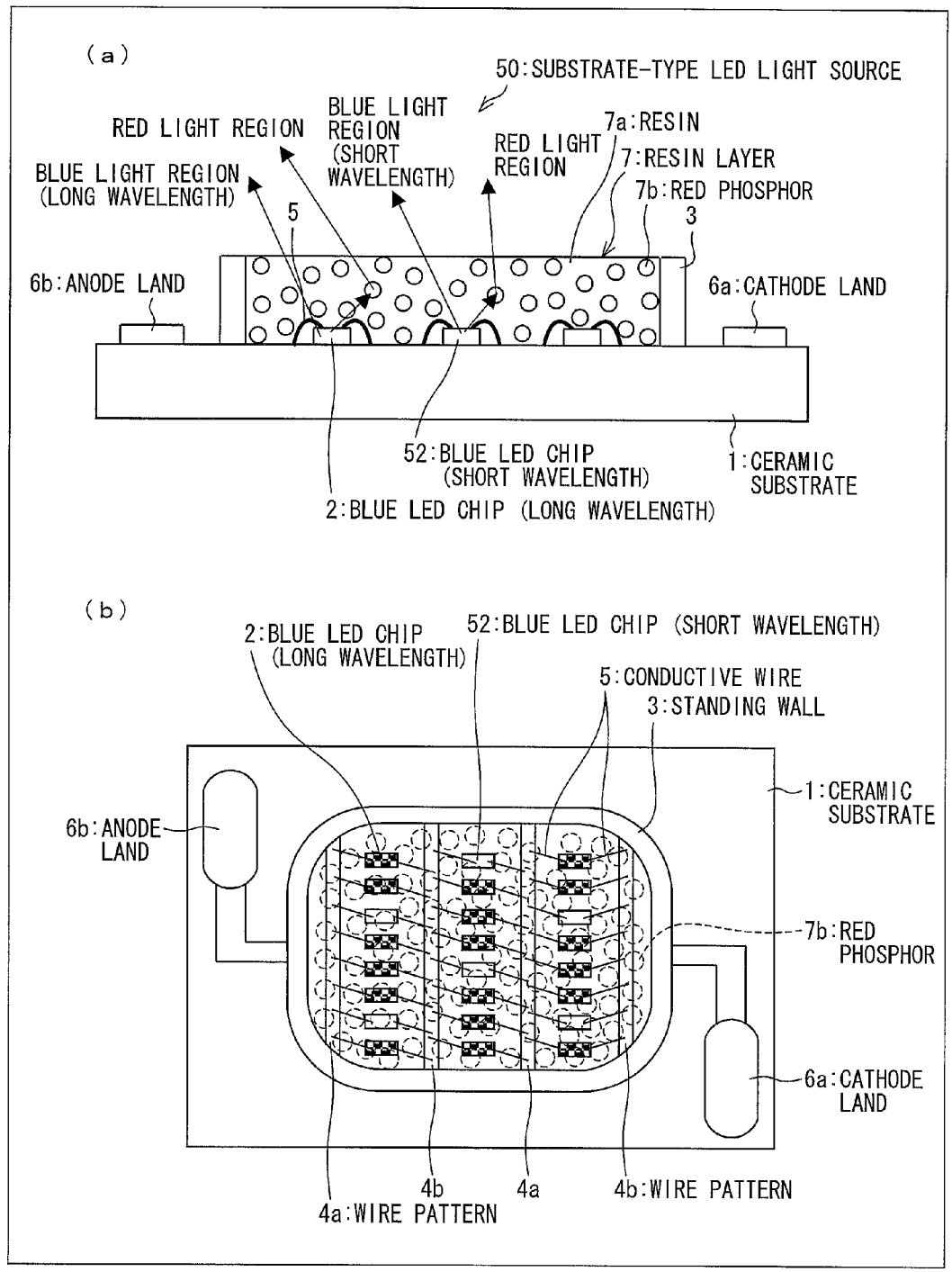

(a) of FIG. 10 shows another embodiment of an LED light source for plant cultivation of the present invention, and is a cross sectional view showing a configuration of a substrate-type LED light source for plant cultivation. (b) of FIG. 10 is a plan view showing a configuration of the substrate-type LED light source for plant cultivation before a resin layer is formed.

Figure 11:
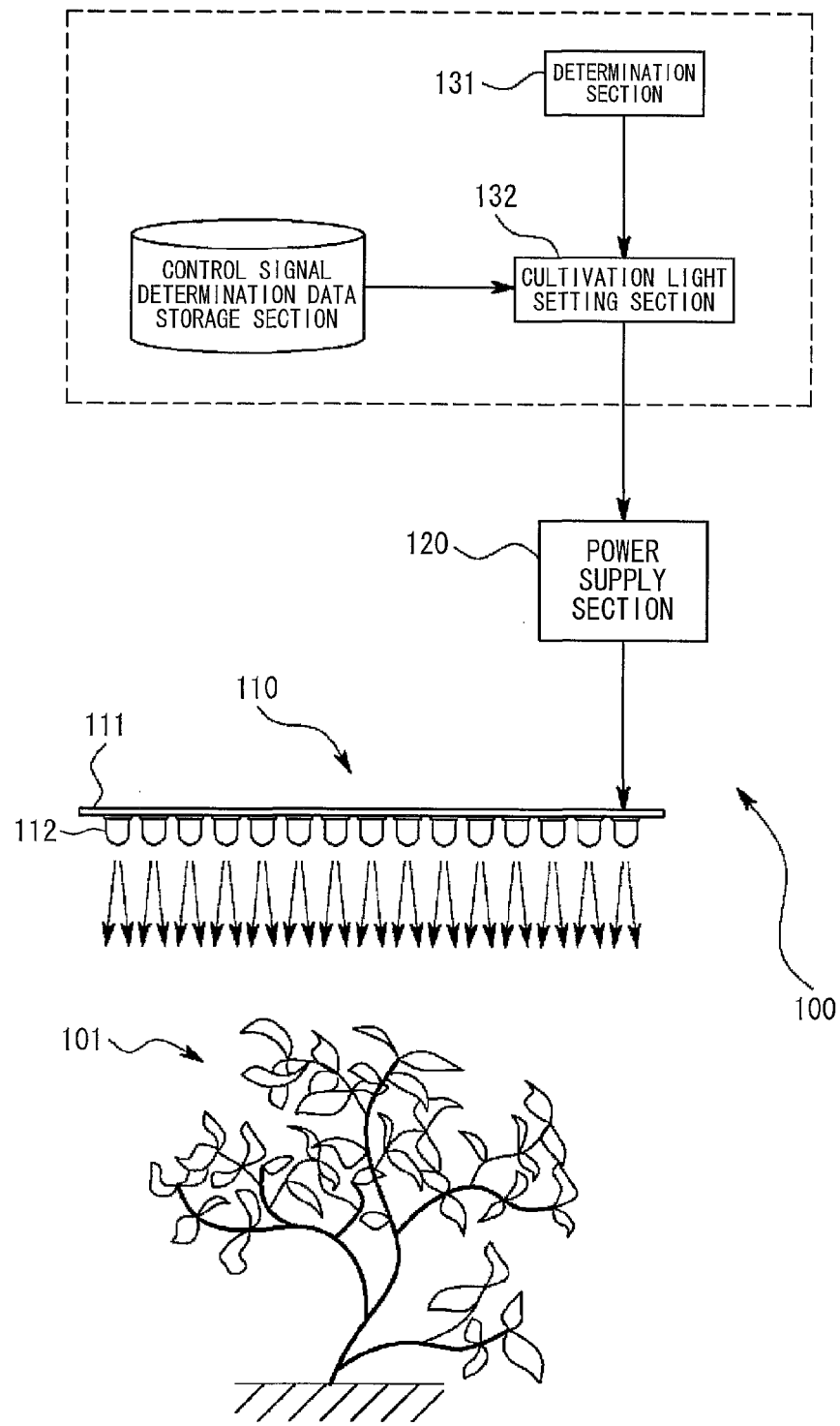

FIG. 11 is a view showing a configuration of a conventional LED light source for plant cultivation.

Figure 12:
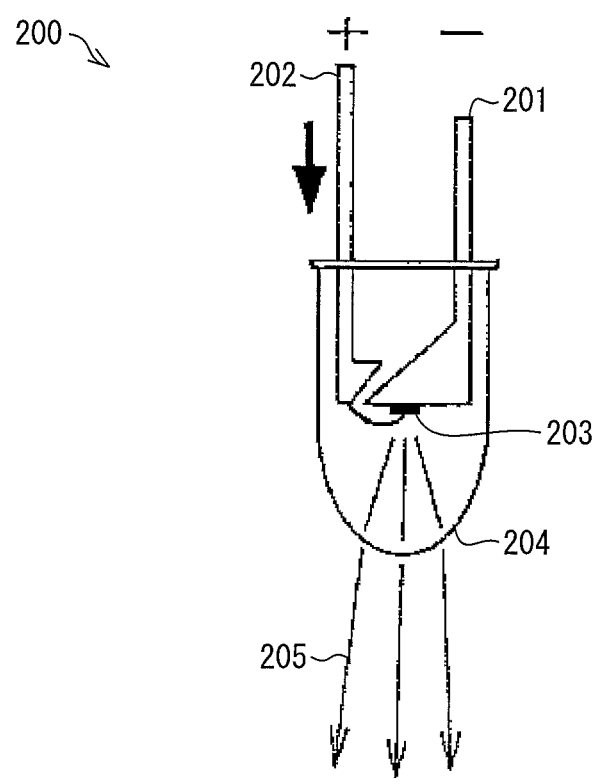

FIG. 12 is a view showing a configuration of another conventional LED light source for plant cultivation.

DESCRIPTION OF EMBODIMENTS

[Embodiment 1]

The following description will discuss one embodiment of the present invention with reference to FIGS. 1 through 8.

(Configuration of LED Light Source for Plant cultivation)

Figure 2:
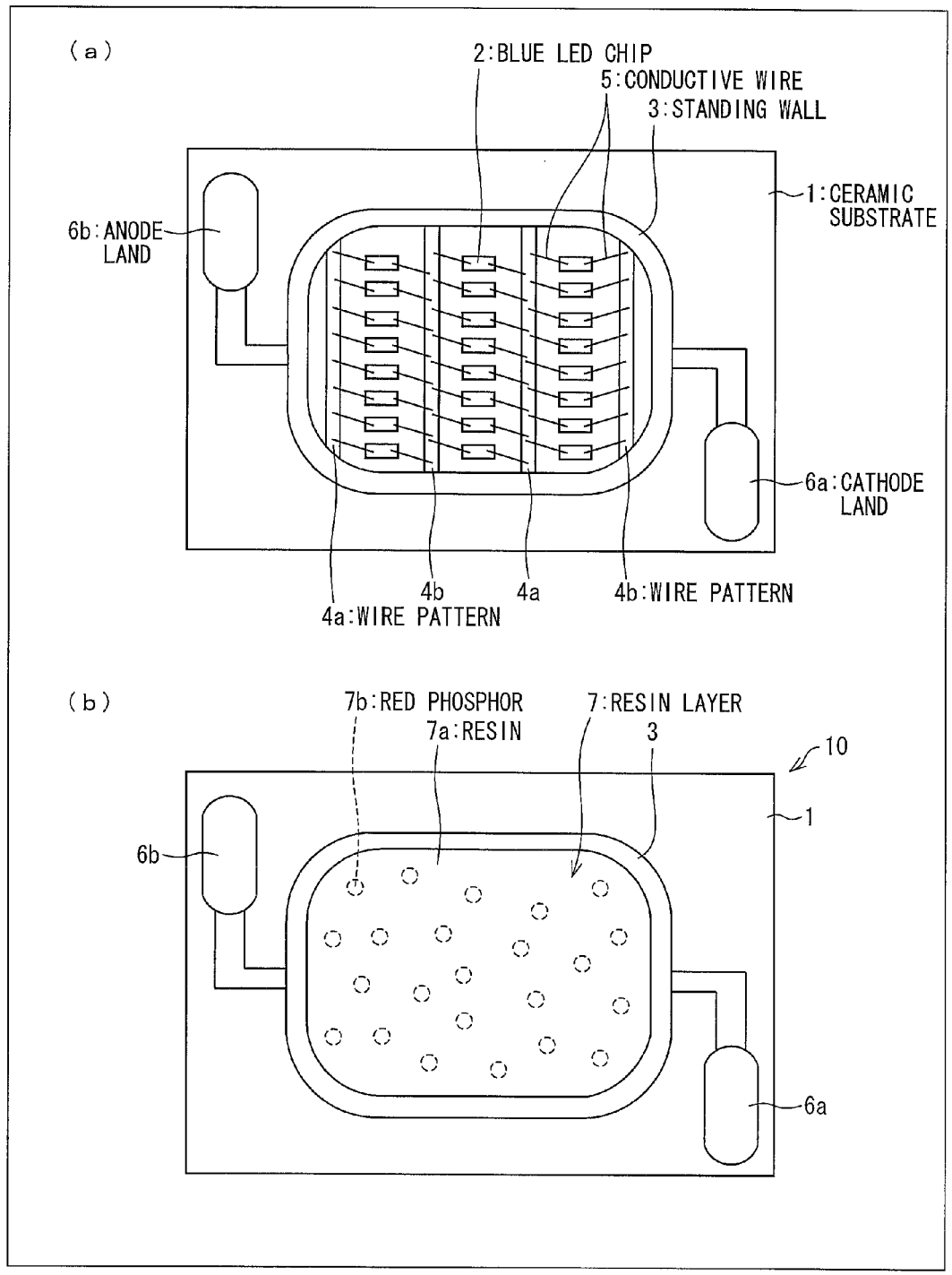

A configuration of an LED light source for plant cultivation of the present embodiment is discussed with reference to (a) and (b) of FIG. 2. (a) of FIG. 2 is a plan view showing an LED light source for plant cultivation before a red phosphor-containing resin is injected. (b) of FIG. 2 is a plan view showing the LED light source for plant cultivation after the red phosphor-containing resin is injected.

A substrate-type LED light source 10 (LED light source for plant cultivation) of the present embodiment is constituted by (i) a ceramic substrate 1 (substrate), (ii) a plurality of blue LED chips 2 provided on the ceramic substrate 1, and (iii) a standing wall 3 which is made of resin and surrounds the plurality of blue LED chips 2 (see (a) of FIG. 2).

In the present embodiment, the blue LED chips 2 are, for example, twenty-four blue LED chips arranged such that three columns, each of which includes eight blue LED chips 2 electrically connected in parallel with each other, are connected in series. Note that, in the present invention, the number of the blue LED chips 2 does not necessarily have to be two or more, and the number can be one (1). Further, in a case where a plurality of blue LED chips 2 are provided, the number of them does not necessarily have to be 24. Furthermore, there is no limitation on how to arrange the plurality of blue LED chips 2. Moreover, how to connect them electrically is not limited to the above.

In a space inside the standing wall 3, each of the blue LED chips 2 is connected, via conductive wires 5, to a wire pattern 4a and a wire pattern 4b, respectively, provided on both sides of a column to which that blue LED chip 2 belongs. The wire pattern 4a and the wire pattern 4b are electrically connected to a cathode land 6a and an anode land 6b, respectively, which are provided on the ceramic substrate 1 but outside the standing wall 3.

Further, the substrate-type LED light source 10 of the present embodiment is provided with a resin layer 7, which fills the space inside the standing wall 3 and covers the plurality of blue LED chips 2 (shown in (b) of FIG. 2). In the resin layer 7, a red phosphor is mixed and dispersed.

Each of the blue LED chips 2 of the present embodiment emits light (first light) having a wavelength of 400 nm to 480 nm which corresponds to a blue light region absorption peak of chlorophyll. On the other hand, a red phosphor 7b is one that emits, upon absorbing the light from the blue LED chips 2, second light having a peak wavelength in a range from 620 nm to 700 nm which corresponds to a red light region absorption peak of chlorophyll.

Note that each of the blue LED chips 2 is not limited to the one that only emits light (first light) having a wavelength of 400 nm to 480 nm which corresponds to the blue light region absorption peak, and can be one that emits light corresponding to a wavelength range of blue through ultraviolet.

(Controlling Proportions of Light in the Blue Light Region and Light in the Red Light Region)

Figure 1:
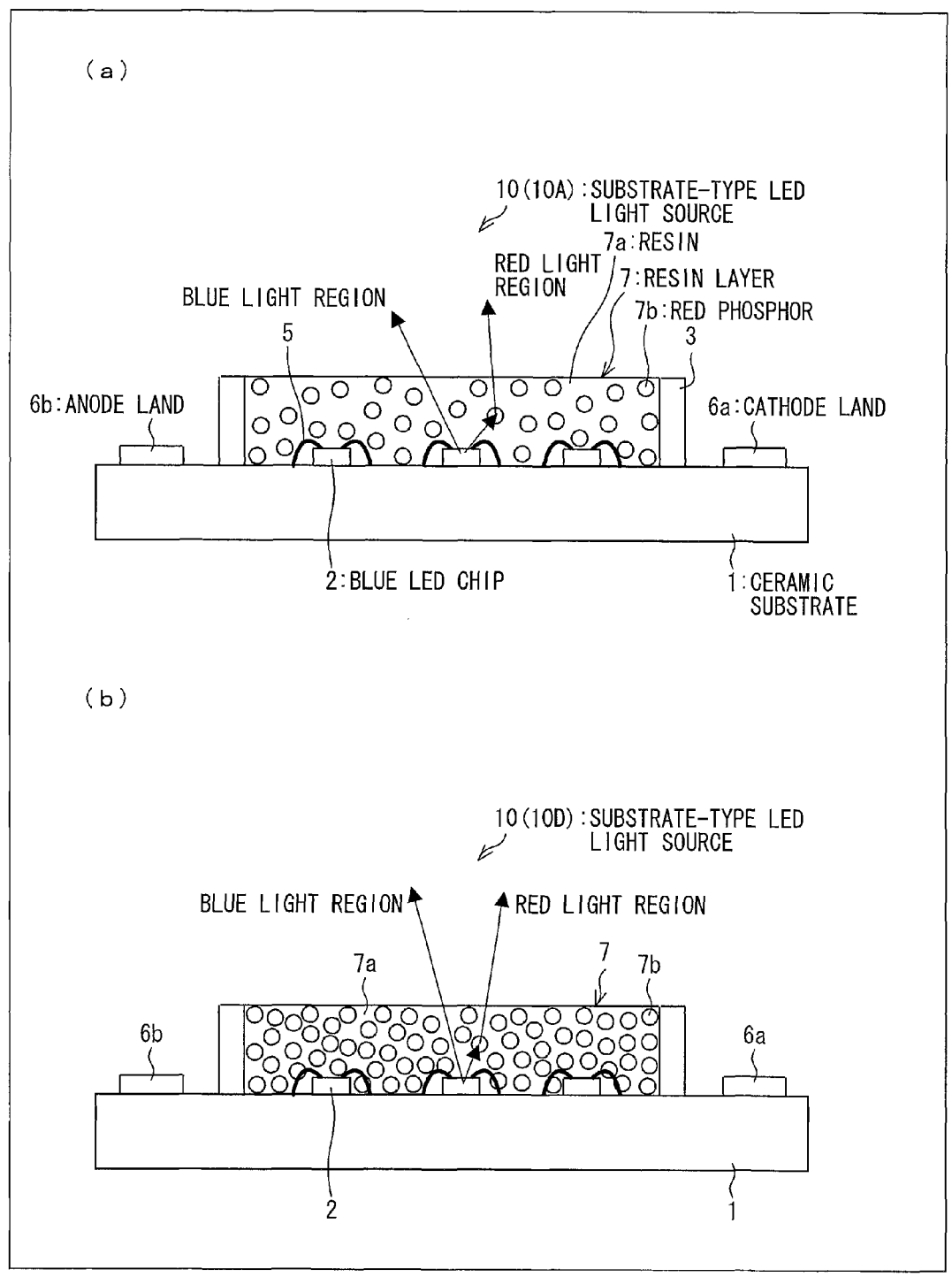
Figure 3:
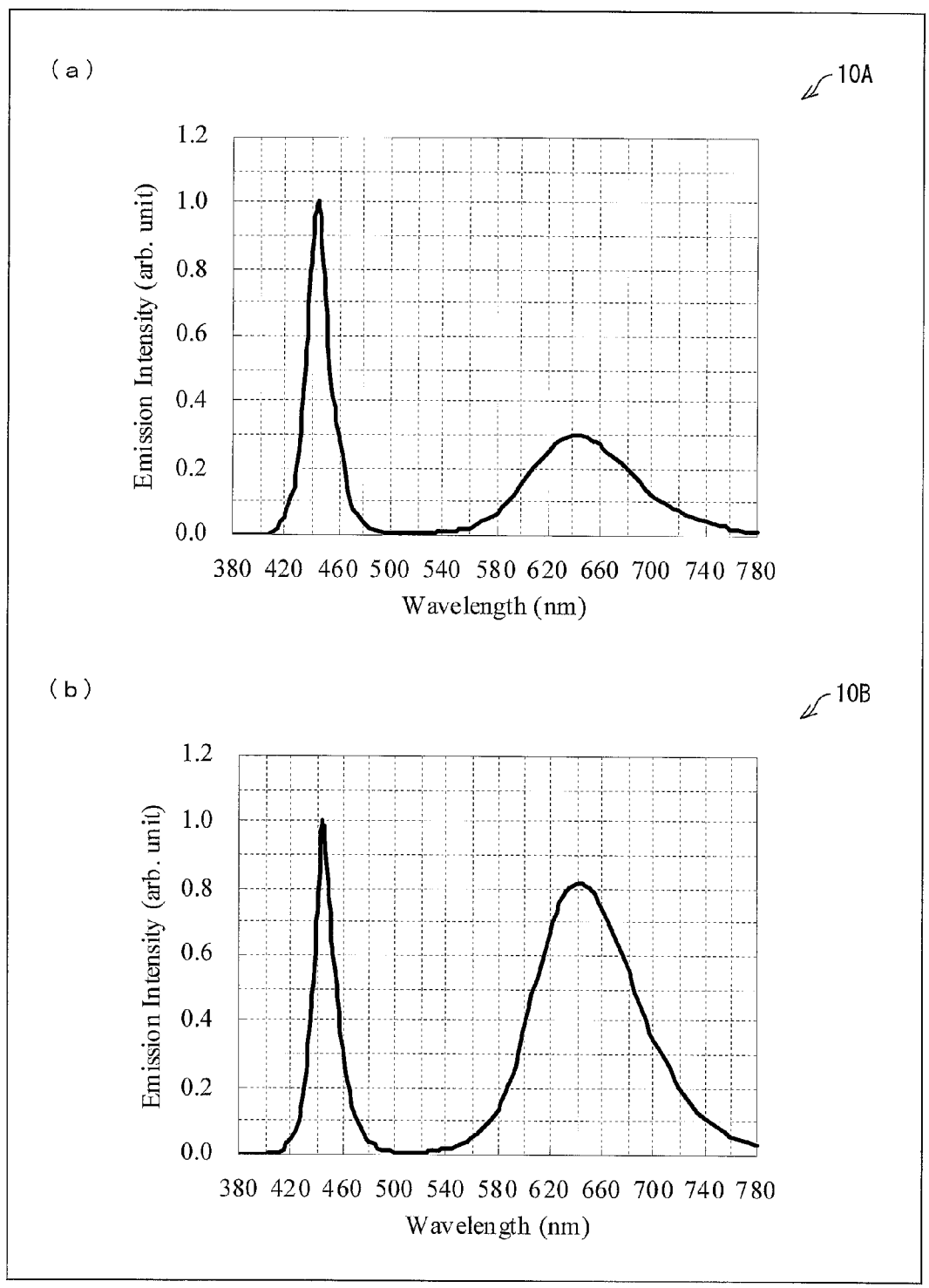

The following description discusses, with reference to (a) and (b) of FIG. 1 and FIG. 3, how the substrate-type LED light source 10 of the present embodiment controls the proportions of light in the blue light region and light in the red light region. (a) and (b) of FIG. 1 are cross-sectional views showing a substrate-type LED light source 10 (10A) and a substrate-type LED light source 10 (10D) which are different from each other in blending ratio of a red phosphor to a silicone resin.

As shown in (a) of FIG. 1, in the substrate-type LED light source 10 of the present embodiment, the resin layer 7 is constituted by (i) a resin 7a (resin) made of silicone resin and (ii) a red phosphor 7b contained in the resin 7a. Therefore, by changing the proportion of the red phosphor 7b in the resin 7a, it is possible to achieve the substrate-type LED light sources 10A and 10D which emit light having respective different wavelengths.

For example, $CaAlSiN_3$:Eu is used as the red phosphor 7b, and, as described earlier, the blue LED chips 2 emit light having a peak wavelength in a range from 400 nm to 480 nm. With this configuration, first light having a wavelength of 400 nm to 480 nm and second light having a wavelength of 620 nm to 700 nm are emitted. Note that $CaAlSiN_3$:Eu is a nitride red phosphor containing divalent europium (Eu) as an activator, and is one of the phosphors having stable temperature characteristics and high luminous efficiency.

Specifically, in a case of the substrate-type LED light source 10A (see (a) of FIG. 1) in which the blending ratio of the red phosphor 7b to the resin 7a is 0.05:1, a spectrum obtained has (i) a peak wavelength (emission intensity: 1.0) at 440 nm and (ii) a peak wavelength (emission intensity: 0.3) at 640 nm (see (a) of FIG. 3). On the other hand, in a case of a substrate-type LED light source 10B in which the blending ratio of the red phosphor 7b to the resin 7a is 0.10:1, a spectrum obtained has (i) a peak wavelength (emission intensity: 1.0) at 440 nm and (ii) a peak wavelength (emission intensity: 0.8) at 640 nm (see (b) of FIG. 3).

Figure 4:
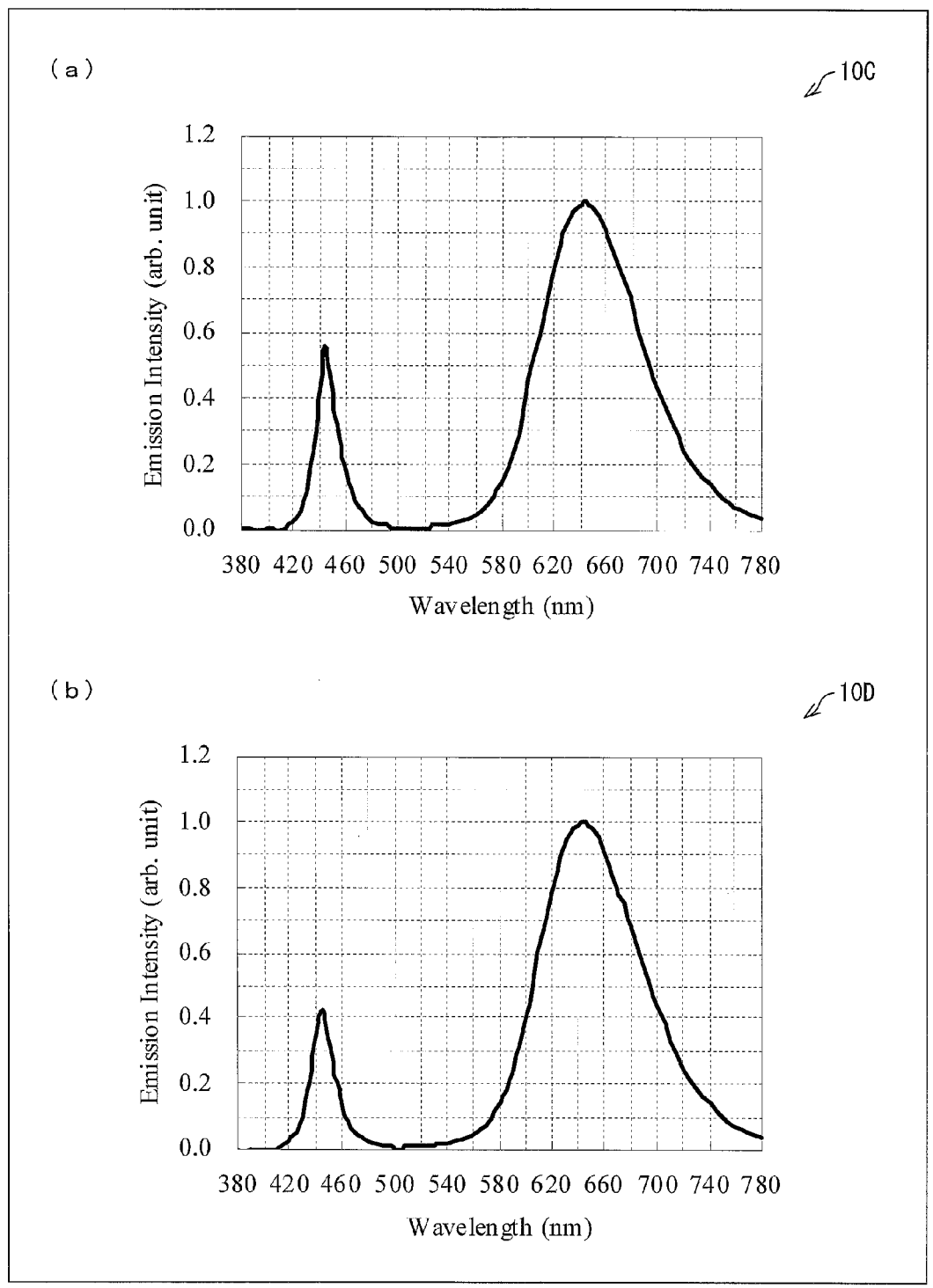

Furthermore, in a case of a substrate-type LED light source 10C in which the blending ratio of the red phosphor 7b to the resin 7a is 0.15:1, a spectrum obtained has (i) a peak wavelength (emission intensity: 0.56) at 440 nm and (ii) a peak wavelength (emission intensity: 1.0) at 640 nm (see (a) of FIG. 4).

Furthermore, in a case of the substrate-type LED light source 10D in which the blending ratio of the red phosphor 7b to the resin 7a is 0.20:1 (see (b) of FIG. 1), a spectrum obtained has (i) a peak wavelength (emission intensity: 0.4) at 440 nm and (ii) a peak wavelength (emission intensity: 1.0) at 640 nm (see (b) of FIG. 4).

As described above, by changing the blending ratio of the red phosphor 7b to the resin 7a, it is possible to easily adjust the proportions of light in the blue light region and light in the red light region.

(Wavelengths of Light Necessary for Growth of Plants)

Figure 5:
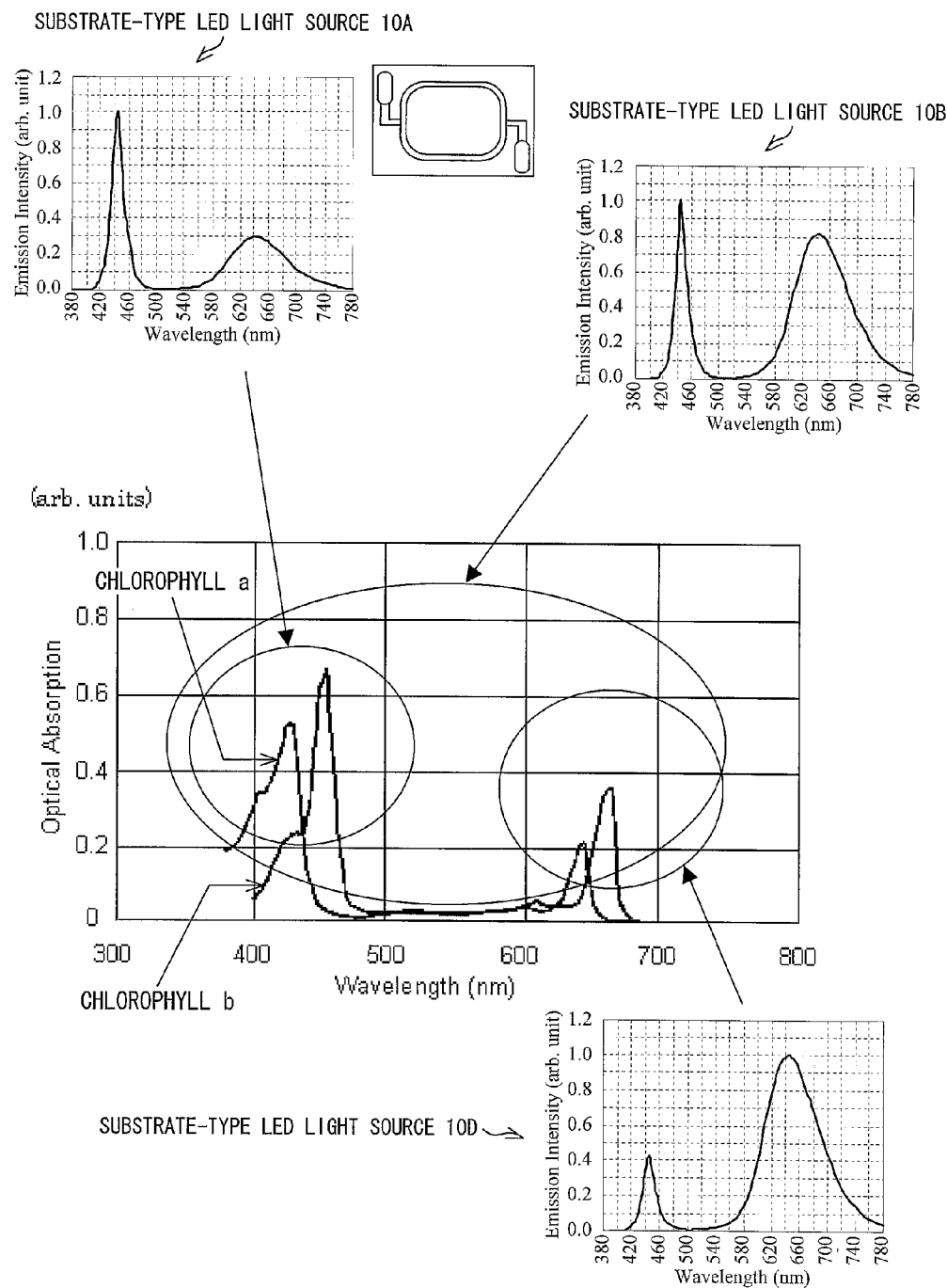
FIG. 5 is a view showing (i) absorption spectra of chlorophyll and (ii) examples of applications of the LED light source of the present embodiment.

The following description discusses, with reference to FIG. 5, what wavelength of light is necessary for the growth of plants. FIG. 5 includes views showing light absorption characteristics of chlorophyll and the spectra of light emitted from the substrate-type LED light sources 10 of the present embodiment.

First, chlorophyll, which plays a dominant role in plants' photosynthesis, does not absorb light in a uniform manner; it shows clear absorption peaks around 660 nm (red) and around 450 nm (blue) (see FIG. 5). In association with this, the wavelength characteristic required for photosynthesis has a second peak around 660 nm and a first peak around 450 nm.

Therefore, in a maturation stage in which plants have leaves and carry out photosynthesis actively, light having both red light component and blue light component is effective for growth.

Meanwhile, blue light having a wavelength of around 450 nm has influence also on photosystems of plants called high-energy reaction systems, and thus is essential for normal morphogenesis of plants. Therefore, in the stages of germination and nursery, the blue light component is especially important.

In this regard, it is clear from FIG. 5 that, among the substrate-type LED light sources 10 of the present embodiment, (i) the substrate-type LED light source 10A of the present embodiment is suitable for a blue light absorption range of chlorophyll and (ii) the substrate-type LED light source 10D of the present embodiment is suitable for a red light absorption range of chlorophyll.

As is clear from above, it is possible to easily cause the substrate-type LED light source 10 of the present embodiment to be suitable for the light absorption characteristics of chlorophyll, by only changing the blending ratio of the red phosphor 7b to the resin 7a.

Meanwhile, in the field of optics, the amount of light is expressed in terms of, for example, photon flux density. Note here that, in a case where a substance is irradiated with sunlight, the photon flux density is a value obtained by dividing, by the area of a surface of the substance, the number of photons with which the surface is irradiated per second. The "photon flux density" is expressed in terms of the number of photons. Therefore, the number is the same both in the case of infrared light and in the case of ultraviolet light. On the other hand, a photochemical reaction occurs only when photons that a pigment can absorb are received. For example, receiving light that chlorophyll cannot absorb means nothing to plants. In view of this, in the field of photosynthesis, there are definitions of "photosynthetic photon flux density" and "photosynthetic photon flux" only for a wavelength range of 400 nm to 700 nm that chlorophyll absorbs. Note that the photosynthetic photon flux is a value obtained by multiplying the photosynthetic photon flux density (PPFD) by the area which receives light. This value does not merely express the absorption peak wavelengths of chlorophyll in the red and blue light regions in terms of energy, but expresses, for the purpose of finding the light intensity necessary for the growth of plants, energy (i.e., energy necessary for photosynthesis) corresponding to the absorption spectra in the red and blue light regions in terms of the number of photons. The photosynthetic photon flux can be found from the spectral characteristics of an LED light source and the energy of one photon of each wavelength.

Therefore, the substrate-type LED light source 10 can be expressed in terms of the photosynthetic photon flux as follows. In the case of the substrate-type LED light source 10A ((a) of FIG. 3), the photosynthetic photon flux is (i) 1 µmol/s in the blue light region of 400 nm to 480 nm and (ii) 1.3 µmol/s in a red light region of 620 nm to 700 nm. Note that the values are found from the area of wavelengths 400 nm to 480 nm in the graph and the area of wavelengths 620 nm to 700 nm in the graph, respectively. When the values are expressed in ratio, the ratio of the photosynthetic photon flux in the red light region of 620 nm to 700 nm to the photosynthetic photon flux in the blue light region of 400 nm to 480 nm is 1.3:1.

On the other hand, in the case of the substrate-type LED light source 10D ((b) of FIG. 4), the photosynthetic photon flux is (i) 0.2 µmol/s in the blue light region of 400 to 480 nm and (ii) 2.0 µmol/s in the red light region of 620 nm to 700 nm. When the values are expressed in ratio, the ratio of the photosynthetic photon flux in the red light region of 620 nm to 700 nm to the photosynthetic photon flux in the blue light region of 400 nm to 480 nm is 10:1.

In the case of the substrate-type light source 10B ((b) of FIG. 3), the ratio of the photosynthetic photon flux in the red light region of 620 nm to 700 nm to the photosynthetic photon flux in the blue light region of 400 nm to 480 nm is 3.5:1. Further, in the case of the substrate-type light source 10C ((a) of FIG. 4), the ratio of the photosynthetic photon flux in the red light region of 620 nm to 700 nm to the photosynthetic photon flux in the blue light region of 400 nm to 480 nm is 7.5:1.

That is, in the present embodiment, the ratio of the photosynthetic photon flux in the red light region of 620 nm to 700 nm to the photosynthetic photon flux in the blue light region of 400 nm to 480 nm falls within a range from 1.3:1: to 10:1. In view of this, it is preferable to configure a substrate-type LED light source 10 such that the substrate-type LED light source 10 is suitable for germination, nursery and maturation of plants.

Specifically, each of the substrate-type LED light sources 10A and 10B is preferably configured such that, in a case where it is provided to a germination shelf or a nursery shelf, the ratio of the photosynthetic photon flux in the red light region of 620 nm to 700 nm to the photosynthetic photon flux in the blue light region of 400 nm to 480 nm falls within a range from 1.3:1 to 3.5:1. This makes it possible to cause the substrate-type LED light sources 10A and 10B to be suitable for germination and nursery of plants.

Further, in the present embodiment, the substrate-type LED light sources 10C and 10D is preferably configured such that, in a case where it is provided to a maturation shelf, the ratio of the photosynthetic photon flux in the red light region of 620 nm to 700 nm to the photosynthetic photon flux in the blue light region of 400 nm to 480 nm falls within a range from 7.5:1: to 10:1. This makes it possible to cause the substrate-type LED light sources 10C and 10D to be suitable for maturation of plants.

Figure 6:
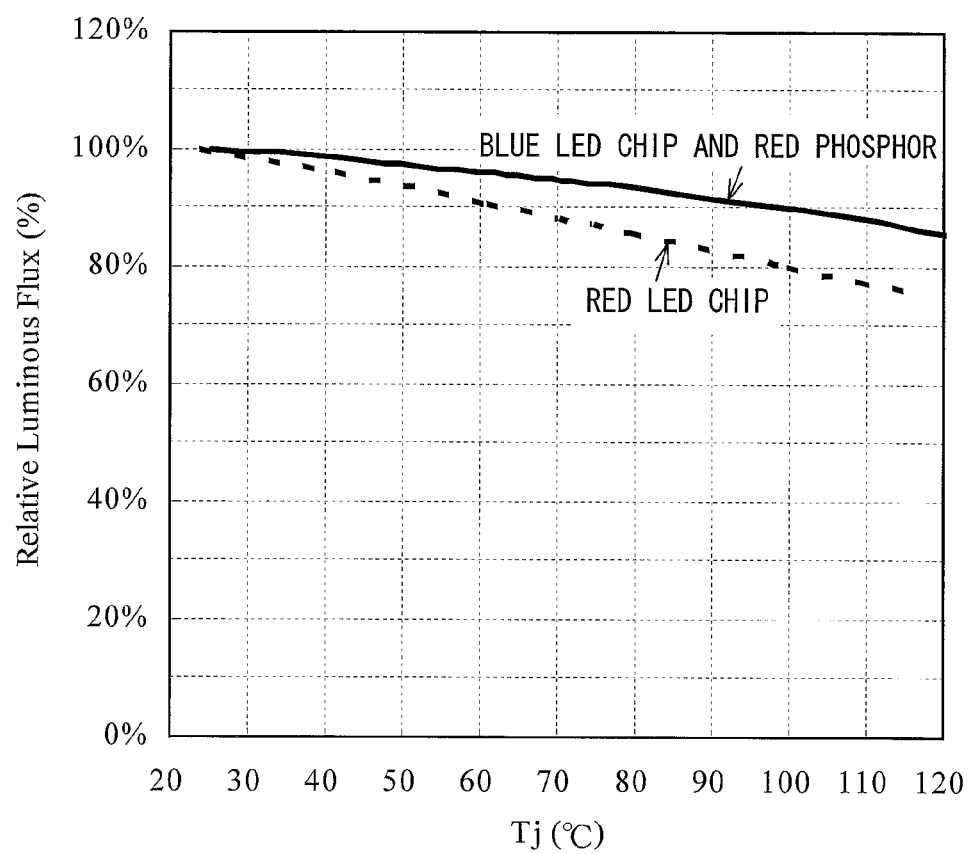
FIG. 6 is a graph showing a temperature characteristic of the LED light source in comparison with a temperature characteristic of a conventional light source.

FIG. 6 shows temperature characteristics in terms of relative luminous flux, of the substrate-type LED light source 10 of the present embodiment and a conventional single red LED for plant cultivation. In FIG. 6, the horizontal axis represents a junction temperature of a mounted chip, whereas the vertical axis represents the relative luminous flux. As is clear from FIG. 6, at high temperatures, the substrate-type LED light source 10 (solid line in FIG. 6) and the conventional single red LED for plant cultivation (broken line in FIG. 6) are different in temperature characteristics from each other by 10%. This is because red LEDs have poor temperature characteristics. In contrast, the temperature characteristics of the substrate-type LED light source 10 of the present embodiment are good, because the red phosphor 7b is used instead of the red LEDs. Therefore, the substrate-type LED light source 10 and a bullet-shape LED lamp 40 (described later) can adjust well to a peak of the light absorption characteristics of chlorophyll.

(Material for Red Phosphor)

As described earlier, in the substrate-type LED light source 10 of the present embodiment, $CaAlSiN_3:Eu$ is used as the red phosphor 7b. Note, however, that the material for the red phosphor 7b is not limited to $CaAlSiN_3:Eu$. The material can be, for example, $(Sr,Ca)AlSiN_3:Eu$. The $(Sr,Ca)AlSiN_3$ is a phosphor which (i) is obtained from $CaAlSiN_3:Eu$ by replacing part of Ca with Sr so that the emission peak wavelength shifts to a shorter wavelength and (ii) has, like $CaAlSiN_3:Eu$, stable temperature characteristics and high luminous efficiency.

Specifically, particularly for plants etc. containing more chlorophyll a than chlorophyll b, it is preferable to use a red phosphor 7b made from $CaAlSiN_3:Eu$ (emission peak: 650 nm to 660 nm). On the other hand, for plants etc. containing more chlorophyll b than chlorophyll a, it is preferable to use a red phosphor 7b made from $(Sr,CA)AlSiN_3:Eu$ which has a shorter emission peak wavelength (620 nm to 630 nm).

Alternatively, the red phosphor 7b can be made from: $3.5MgO.0.5MgF_2.GeO_2:Mn$, $La_2O_2S:Eu$, $Y_2O_2S:Eu$, $LiEuW_2O_8$, $(Y,Gd,Eu)_2O_3$, $(Y,Gd,Eu)BO_3$; and/or $YVO_4:Eu$ and $CaS:Eu,Ce,K$.

It is needless to say that two types of red phosphors 7b, such as $CaAlSiN_3:EU$ and $(Sr,Ca)AlSiN_3:Eu$, can be used in combination. This is effective for cultivation of a plant which contains chlorophyll a and chlorophyll b in equal amounts.

Also in regard to the light absorption characteristics in the blue light region of chlorophyll, the peak wavelength of each of the blue LED chips 2 can be set as appropriate so as to correspond to absorption peaks of chlorophyll a and chlorophyll b. For example, it is preferable to use (i) a blue LED chip 2 (type I) having a peak in a range from 430 nm to 440 nm, for a plant containing a large amount of chlorophyll a and (ii) a blue LED chip 2 (type II) having a peak in a range from 450 nm to 460 nm, for a plant containing a large amount of chlorophyll b.

Furthermore, the substrate-type LED light source 10 can be configured such that a combination of the blue LED chip 2 and the red phosphor 7b matches the types of chlorophyll a and chlorophyll b. For example, the substrate-type LED light sources 10 can include various combinations such as (i) a combination of the blue LED chip 2 (type I) and the red phosphor 7b made of $CaAlSiN_3:Eu$ and (ii) a combination of the blue LED chip 2 (type II) and the red phosphor 7b made of $(Sr,Ca)AlSiN_3:Eu$.

In this case, in each configuration, the blending ratio of the red phosphor 7b to the resin 7a is controlled appropriately so that desired proportions of light are obtained.

(Configuration of Substrate-Type LED Light Source Necessary for Human Operation (Illumination LED Light Source))

The substrate-type LED light source 10 as described above is an LED light source for plant cultivation. Note, however, that the substrate-type LED light source 10 can be used as an illumination LED light source 20 which is necessary for human operation. This can be easily achieved.

That is, in the resin layer 7 which covers the blue LED chips 2 of the foregoing substrate-type LED light source 10, a green phosphor 7c is mixed and dispersed in the resin 7a in addition to the red phosphor 7b (see (a), (b), and (c) of FIG. 7).

Specifically, the illumination LED light source 20 is constituted by (i) a ceramic substrate 1, (ii) a plurality of blue LED chips 2 provided on the ceramic substrate 1 and (iii) a standing wall 3 which surrounds the plurality of blue LED chips 2.

In the present embodiment, the blue LED chips 2 are, for example, 156 blue LED chips arranged such that thirteen lines, each of which includes twelve blue LED chips 2 connected in series, are connected in parallel with each other. Note that, in the present invention, the number of blue LED chips 2 does not necessarily have to be two or more, and the number can be one (1). Further, in a case where a plurality of blue LED chips 2 are provided, the number of them does not necessarily have to be 156. Furthermore, there is no limitation on how to arrange the plurality of the blue LED chips 2.

In the space inside the standing wall 3, each of the blue LED chips 2 is electrically connected, via conductive wires 5, to a wire pattern 4a and a wire pattern 4b, respectively, provided on both sides of a column to which that blue LED chip 2 belongs. The wire pattern 4a and the wire pattern 4b are electrically connected to a cathode land 6a and an anode land 6b, respectively, which are provided on the ceramic substrate 1 but outside the standing wall 3.

Further, the illumination LED light source 20 of the present embodiment is provided with a resin layer 7, which fills the space inside the standing wall 3 and covers the plurality of blue LED chips 2 (shown in (b) of FIG. 7). The resin layer 7 is constituted by (i) a resin 7a made of silicone resin and (ii) a red phosphor 7b and a green phosphor 7c mixed and dispersed in the resin 7a.

Note here that, in the illumination LED light source 20, the resin 7a, the red phosphor 7b and the green phosphor 7c are mixed in the proportions of, for example, 1:0.01:0.10. These proportions give the emission spectrum as shown in (c) of FIG. 7. In the emission spectrum shown in (c) of FIG. 7, the amount of light is large at around 550 nm which humans feel the brightest. This shows that the illumination LED light source 20 is effective as an illumination light source for human operation.

(Application to Plant Factories)

Next, an application of the substrate-type LED light source 10 of the present embodiment to a plant factory is discussed with reference to FIG. 8. FIG. 8 is a view showing an example of a plant factory 30 in which substrate-type LED light sources 10 and illumination LED light sources 20 of the present embodiment are used.

As shown in FIG. 8, in the plant factory 30 of the present embodiment, for example (i) 1300 substrate-type LED light sources 10A are provided to germination shelves, (ii) 4600 substrate-type LED light sources 10A are provided to nursery shelves and (iii) 17000 substrate-type LED light sources 10D are provided to maturation shelves. Further, 350 illumination LED light sources 20 are provided to a shipment shelf where humans work.

As has been described, a light emitting device of the present embodiment includes (i) at least one blue LED chip 2 (at least one first LED chip) which emits first short-wavelength-region light having a wavelength of 400 nm to 480 nm corresponding to a blue light region absorption peak (first peak wavelength) of chlorophyll, which first peak wavelength is one, of a plurality of peak wavelengths of light absorbed by a plant which requires the light for photosynthesis to grow, which is in a relatively short wavelength region; and (ii) a resin layer 7 (phosphor-containing sealing resin) which covers the at least one blue LED chip 2. The resin layer 7 contains a red phosphor 7b (phosphor) which emits long-wavelength-region light upon absorbing the first short-wavelength-region light emitted from the at least one blue LED chip 2. The long-wavelength-region light has a wavelength of 620 nm to 700 nm and corresponds to a red light region absorption peak of chlorophyll which is one, of the plurality of peak wavelengths, which is in a longer wavelength region than the first peak wavelength.

Specifically, in many cases, photosynthetic plants require, for their growth, light having (i) a first peak wavelength in the relatively short wavelength region and (ii) a peak wavelength in a longer wavelength region than the first peak wavelength. In view of the circumstances, the light emitting device of the present embodiment includes (a) the at least one blue LED chip 2 which emits the first short-wavelength-region light corresponding to the first peak wavelength and (ii) the resin layer 7 which covers the at least one blue LED chip 2. The red phosphor 7b contained in the resin layer 7 emits the long-wavelength-region light corresponding to the peak wavelength in the longer wavelength region than the first peak wavelength.

As a result, the light emitting device does not require the use of two types of LED chips (separately provided blue LED chip and red LED chip) to emit light corresponding to the blue light region absorption peak and the red light region absorption peak of chlorophyll etc. which light is necessary for the growth of organisms such as plants, and is capable of emitting such light with use of only one type of LED chip (blue LED chip). Therefore, the light emitting device does not occupy a large area. Moreover, in this configuration, since the red phosphor is to be dispersed in the resin layer, it is possible to disperse the red phosphor in the resin at a predetermined blending ratio. By changing the blending ratio, it is possible to change the amount of light in a blue light region and the amount of light in a red light region.

Accordingly, it is possible to provide a light emitting device capable of, despite only having a simple configuration and occupying a small area, (i) easily adjusting the proportions of light in the blue light region and light in the red light region and (ii) emitting blue light and red light mixed with little spatial color unevenness.

Further, an LED light source for plant cultivation of the present embodiment includes: at least one blue LED chip 2 having an emission peak in a range from 400 nm to 480 nm so as to correspond to a blue light region absorption peak of chlorophyll; a red phosphor 7b which emits, upon receiving excitation light from the at least one blue LED chip 2, light having a peak wavelength in a range from 620 nm to 700 nm so as to correspond to a red light region absorption peak of chlorophyll; and a resin layer 7 in which the red phosphor 7b is dispersed and which covers the at least one blue LED chip 2.

According to the configuration, the LED light source for plant cultivation is constituted by (i) the at least one blue LED chip 2 and (ii) the resin layer 7 which covers the at least one blue LED chip 2 and in which the red phosphor 7b is dispersed. In the configuration, the at least one blue LED chip 2 is capable of emitting light having a wavelength of 400 nm to 480 nm so as to correspond to the blue light region absorption peak of chlorophyll. Further, the red phosphor 7b emits, upon receiving the excitation light from the at least one blue LED chip 2, light having a peak wavelength in a range from 620 nm to 700 nm so as to correspond to the red light region absorption peak of chlorophyll.

As a result, the LED light source for plant cultivation does not require the use of two types of LED chips (separately provided blue LED chip 2 and red LED chip) to emit light corresponding to the blue light region absorption peak and the red light region absorption peak of chlorophyll which light is necessary for the growth of plants, and is capable of emitting such light with use of only one type of LED chip (blue LED chip). Therefore, the LED light source for plant cultivation does not occupy a large area. Moreover, in this configuration, since the red phosphor 7b is to be dispersed in the resin layer, it is possible to disperse the red phosphor 7b in the resin at a predetermined blending ratio. By changing the blending ratio, it is possible to change the amount of light in a blue light region and the amount of light in a red light region.

Accordingly, it is possible to provide an LED light source for plant cultivation capable of, despite only having a simple configuration and occupying a small area, (i) easily adjusting the proportions of light in the blue light region and light in the red light region and (ii) emitting blue light and red light mixed with little spatial color unevenness.

Further, the substrate-type LED light source 10 of the present embodiment is preferably configured such that a ratio of a photosynthetic photon flux in a red light region of 620 nm to 700 nm to a photosynthetic photon flux in a blue light region of 400 nm to 480 nm falls within a range from 1.3:1 to 10:1. This makes it possible to provide a substrate-type LED light source 10 suitable for germination, nursery, and maturation of plants.

Further, the substrate-type LED light source 10 of the present embodiment is configured such that a blending ratio of the red phosphor 7b in the resin layer 7 to the resin 7a in the resin layer 7 falls within a range from 0.05:1 to 0.20:1. This makes it possible to provide a substrate-type LED light source 10 suitable for germination, nursery, and maturation of plants.

The substrate-type LED light source 10 of the present embodiment is preferably configured such that, in a case where it is to be provided to a germination shelf or a nursery shelf, a blending ratio of the red phosphor 7b in the resin layer 7 to the resin 7a in the resin layer 7 falls within a range from 0.05:1 to 0.10:1.

Specifically, chlorophyll, which plays a dominant role in plants' photosynthesis, does not absorb light in a uniform manner; it shows clear absorption peaks around 660 nm (red) and around 450 nm (blue). In association with this, the wavelength characteristics required for photosynthesis show a second peak at around 660 nm and a first peak at around 450 nm. That is, in a maturation stage in which plants have leaves and carry out photosynthesis actively, light having both blue light component and red light component is effective for growth. Meanwhile, blue light having a wavelength of around 450 nm has influence also on photosystems of plants called high-energy reaction systems, and thus is essential for normal morphogenesis of plants. Therefore, in the stages of germination and nursery, the blue light component is especially important.

In this regard, according to the present embodiment, a ratio of the red phosphor 7b in the resin layer 7 to the resin 7a in the resin layer 7 falls within a range from 0.05:1 to 0.10:1. Such a ratio makes it possible to provide a substrate-type LED light source 10 capable of easily emitting light containing blue light component essential for normal morphogenesis of plants in the stages of germination and nursery.

The substrate-type LED light source 10 of the present embodiment is configured such that, in a case where it is to be provided to a maturation shelf, a ratio of the red phosphor 7b in the resin layer 7 to the resin 7a in the resin layer 7 falls within a range from 0.15:1 to 0.20:1. This makes it possible to provide a substrate-type LED light source 10 capable of easily emitting light having both blue light component and red light component in the maturation stage in which plants have leaves and carry out photosynthesis actively.

Further, the substrate-type LED light source 10 of the present embodiment is preferably configured such that, in a case where it is to be provided to a germination shelf or a nursery shelf, a ratio of a photosynthetic photon flux in a red light region of 620 to 700 nm to a photosynthetic photon flux in a blue light region of 400 nm to 480 nm falls within a range from 1.3:1: to 3.5:1. This makes it possible to provide a substrate-type LED light source 10 suitable for germination and nursery of plants.

Further, the substrate-type LED light source 10 of the present embodiment is preferably configured such that, in a case where it is to be provided to a maturation shelf, a ratio of a photosynthetic photon flux in a red light region of 620 nm to 700 nm to a photosynthetic photon flux in a blue light region of 400 nm to 480 nm falls within a range from 7.5:1 to 10:1. This makes it possible to provide a substrate-type LED light source 10 suitable for maturation of plants.

Further, the substrate-type LED light source 10 of the present embodiment is preferably configured such that, for cultivation of a plant containing more chlorophyll a than chlorophyll b, the red phosphor 7b contains a $CaAlSiN_3$:Eu component.

Specifically, plants contain chlorophyll a and chlorophyll b. The chlorophyll a and chlorophyll b have respective different light absorption characteristics. More specifically, chlorophyll a has an absorption peak at 650 nm to 660 nm in the red light region, whereas chlorophyll b has an absorption peak at 620 nm to 630 nm in the red light region.

In view of the circumstances, the LED light source for plant cultivation of the present embodiment is configured such that, for cultivation of a plant containing more chlorophyll a than chlorophyll b, the red phosphor contains a $CaAlSiN_3$:Eu component. That is, the red phosphor containing the $CaAlSiN_3$:Eu component is capable of emitting light having a peak wavelength in a range from 650 nm to 660 nm.

Therefore, for cultivating a plant containing more chlorophyll a than chlorophyll b, it is preferable to use a red phosphor 7b containing a $CaAlSiN_3$:Eu component.

The substrate-type LED light source 10 of the present embodiment is preferably configured such that, for cultivation of a plant containing more chlorophyll b than chlorophyll a, the red phosphor 7b contains a $(Sr,Ca)AlSiN_3$:Eu component.

That is, chlorophyll b has an absorption peak at 620 nm to 630 nm in the red light region, and a red phosphor containing a $(Sr,Ca)AlSiN_3$:Eu component is capable of emitting light having a peak wavelength in a range from 620 nm to 630 nm.

Therefore, for cultivating a plant containing more chlorophyll b than chlorophyll a, it is preferable to use a red phosphor 7b containing a $(Sr,Ca)AlSiN_3$:Eu component.

Further, the substrate-type LED light source 10 of the present embodiment is configured such that (i) a plurality of blue LED chips 2 are provided on a ceramic substrate 1, and a standing wall 3 is provided around the plurality of blue LED chips 2 and (ii) a space inside the standing wall 3 is filled with a resin 7a in which a red phosphor 7b is dispersed.

This makes it possible to provide a so-called substrate-type LED light source 10. Since this configuration is such that a plurality of blue LED chips 2 are included in a single substrate-type LED light source, it is possible to emit a large amount of light with use of only a single substrate-type LED light source. Furthermore, since the red phosphor 7b dispersed in the resin 7a is used instead of a red LED chip, it is possible to considerably reduce the installation area for a plurality of red LED chips corresponding to the plurality of blue LED chips 2.

Accordingly, it is possible to emit a large amount of light with use of a single substrate-type LED light source 10 which occupies only a small area.

Further, the substrate-type LED light source 10 of the present embodiment is configured to emit (i) first light having a wavelength of 400 nm to 480 nm and (ii) second light having a wavelength of 620 nm to 700 nm.

This makes it possible to produce both blue and red peaks necessary for the growth of plants, with use of a single substrate-type LED light source 10. Since a single substrate-type LED light source 10 is capable of producing both peaks, the substrate-type LED light source 10 occupies a smaller area, is more dependable and is more suitable for use in plant factories etc.

Further, according to the substrate-type LED light source 10 of the present embodiment, the first light is light from the at least one blue LED chip 2 and the second light is light from the red phosphor 7b. That is, according to the substrate-type LED light source 10, peaks of the light absorption characteristics of chlorophyll are generated from areas which are close to each other. Therefore, the first light and the second light from the substrate-type light source 10 are shone in a uniform manner.

Specifically, part of the first light emitted from the blue LED chip 2 is absorbed by the red phosphor 7b and converted to the second light by the red phosphor 7b, whereas the other is scattered by the red phosphor 7b. Since each particle of the red phosphor 7b serves as a point light source, blue light or red light is emitted in a uniform manner.

This makes it possible to produce both blue and red peaks necessary for the growth of plants, with use of a single substrate-type LED light source 10. Since a single substrate-type LED light source 10 is capable of producing both peaks, the substrate-type LED light source 10 occupies a smaller area, is more dependable and is more suitable for use in plant factories etc.

Further, a plant factory 30 of the present embodiment includes: the substrate-type LED light source 10A and/or the substrate-type LED light source 10B; and the substrate-type LED light source 10C and/or the substrate-type LED light source 10D.

Accordingly, it is possible to provide a plant factory 30 including a substrate-type LED light source 10 capable of, despite only having a simple configuration and occupying a small area, easily adjusting the proportions of light in the blue light region and light in the red light region.

Note that the present invention is not limited to the foregoing embodiment and can be altered in various manners within the scope of the present invention.

For example, in (a) and (b) of FIG. 1, nothing is provided on a back surface of the ceramic substrate 1. Note, however, that this does not imply any limitation. For example, a finned heat sink can be attached to the back surface of the ceramic substrate 1 which also serves as a heat radiation plate for the substrate-type LED light source 10. That is, the finned heat sink can be attached to a surface opposite to a surface on which blue LED chips 2 are provided. This makes it possible to cool the ceramic substrate 1 with use of the finned heat sink, by use of air flow in a room of a plant factory. Note that, in this case, it is preferable that an opening of the finned heat sink opens in a direction of the air flow.

Alternatively, a tube which allows a nutrient solution to flow therein can be provided to the back surface of the ceramic substrate 1. This makes it possible to cool the substrate-type LED light source 10 in a preferable manner, and thus possible to stably emit first light and second light which are suitable for peaks of the light absorption characteristics of chlorophyll.

As described above, the substrate-type LED light source 10 of the present embodiment is preferably configured such that a finned heat sink, which serves as cooling means, is provided on the back surface of the ceramic substrate 1.

This makes it possible to cool the blue LED chips 2 whose temperatures have increased.

[Embodiment 2]

The following description will discuss another embodiment of the present invention with reference to FIG. 9. Note that configurations other than those described in the present embodiment are the same as those of Embodiment 1. Further, for convenience of description, members having functions identical to those illustrated in the drawings of Embodiment 1 are assigned identical referential numerals, and their descriptions are omitted here.

The substrate-type LED light source 10 and the illumination LED light source 20 described in Embodiment 1 each include (i) a ceramic substrate 1 and (ii) at least one blue LED chip 2 provided on the ceramic substrate 1. An LED light source for plant cultivation of the present embodiment is different from those described in Embodiment 1 in that it has a typical bullet shape as shown in (a) and (b) of FIG. 9.

The following description discusses a configuration of an LED light source for plant cultivation of the present embodiment with reference to (a) and (b) of FIGS. 9. (a) and (b) of FIG. 9 are cross-sectional views each schematically showing a configuration of a bullet-shape LED lamp.

As shown in (a) and (b) of FIG. 9, a bullet-shape LED lamp 40 (LED light source for plant cultivation) of the present embodiment includes (i) a mount lead cup (cup) 41, (ii) a blue LED chip 2 bonded in the mount lead cup 41, (iii) a resin layer 7 constituted by a resin 7a made of silicone resin and a red phosphor 7b, (iv) conductive wires 5 (conductive wires), (v) an anode lead frame 42 (anode lead), (vi) a cathode lead frame 43 (cathode lead) and (vii) a sealing resin 44 made of epoxy resin, which sealing resin 44 has a shape of a bullet and encloses all the members except an end of the anode lead frame 42 and an end of the cathode lead frame 43. The red phosphor 7b used here can be $CaAlSiN_3$:Eu, for example.

The bullet-shape LED lamp 40 is produced in the following manner. The blue LED chip 2 is bonded in the mount lead cup 41. Next, (i) the blue LED chip 2 and a mount lead (not illustrated) are electrically connected via a conductive wire 5 and (ii) the blue LED chip 2 and an inner lead (not illustrated) are electrically connected via another conductive wire 5. After that, the red phosphor 7b is mixed into the resin 7a and dispersed in the resin 7a, and the resin 7a is poured into the mount lead cup 41 to form the resin layer 7. As a result, the resin layer 7 covers and fixes the blue LED chip 2. Lastly, all the members are covered and protected by the sealing resin 44 made of epoxy resin.

According to the bullet-shape LED lamp 40, the blue LED chip 2 emits light (first light) having a wavelength of 400 nm to 480 nm. The first light corresponds to a blue light region absorption peak of chlorophyll. On the other hand, the red phosphor 7b emits, upon absorbing the light from the blue LED chip 2, second light having a peak wavelength in a range from 620 nm to 700 nm. The second light corresponds to a red light region absorption peak of chlorophyll.

substrate-type LED light source 10. Therefore, the substrate-type LED light source 10 of Embodiment 1 and the bullet-shape LED lamp 40 of Embodiment 2 can be used in combination.

Lastly, Table 1 shows a comparison of (i) a substrate-type LED light source 10 of Embodiment 1, (ii) a bullet-shape LED lamp 40 of Embodiment 2, and (iii) a combination of a conventional bullet-shape red LED lamp and a conventional bullet-shape blue LED lamp.

TABLE 1

| | Embodiment 1 Substrate-type LED light source | Embodiment 2 Bullet-shape LED lamp | Conventional example Bullet-shape red LED lamp and bullet-shape blue LED lamp |
|---|---|---|---|
| Material | Ceramic substrate and silicone resin | Epoxy resin Phosphor-containing resin is phosphor-containing silicone resin | Epoxy resin |
| Reliability | Reliability is improved because no epoxy resin is used and thus there is a smaller deterioration in resin | Reliability is improved because short-wavelength component (cause of deterioration) is converted into red component | Depends on the life of red LED chip Transmittance of resin decreases due to short-wavelength light |
| Cost | Processing cost is reduced due to good chromaticity achieved by controlling the amount of phosphor-containing resin Packaging cost is reduced because only one type of LED chip (blue LED chip) is used and thus the LED chip can be packed into a single package by a high-density packaging technique Cost is reduced because red phosphor is used in place of red LED chip | Cost is reduced because red phosphor is used in place of red LED chip | Red LED chip is expensive (in the case of high-power red LED chip for illumination, the price is more than twice the price of blue LED chip) |
| Characteristics | Temperature characteristic is improved (by approximately 10%) because no red LED chip is used | Temperature characteristic is improved (by approximately 10%) because no red LED chip is used | Temperature characteristic of red LED chip is not good |
| Installation area | ⅙ (assuming that a conventional example is 1) | ⅓ (assuming that a conventional example is 1) | 1 |
| Life | 40,000 hours at an ambient temperature of 50° C. | 15,000 hours at an ambient temperature of 50° C. | 5,000 hours at an ambient temperature of 50° C. |

In the present embodiment, the bullet-shape LED lamp 40 of the present embodiment as shown in (a) of FIG. 9 is a bullet-shape LED lamp 40A in which the blending ratio of the red phosphor 7b to the resin 7a is 0.05:1. The bullet-shape LED lamp 40A is configured to emit light having the same spectrum as that (see (a) of FIG. 3) of the substrate-type LED light source 10A of Embodiment 1. Therefore, the bullet-shape LED lamp 40A corresponds to the blue light region absorption peak of chlorophyll, and is preferably used for germination and nursery. Note, however, that this does not imply any limitation. The bullet-shape LED lamp 40 can also be configured such that the blending ratio of the red phosphor 7b to the resin 7a is 0.10:1 to 0.15:1.

On the other hand, the bullet-shape LED lamp 40 as shown in (b) of FIG. 9 is a bullet-shape LED lamp 40D in which the blending ratio of the red phosphor 7b to the resin 7a is 0.20:1. That is, the bullet-shape LED lamp 40D is configured to emit light having the same spectrum as that (see (b) of FIG. 4) of the substrate-type LED light source 10D of Embodiment 1. As such, the bullet-shape LED lamp 40D corresponds to the red light region absorption peak of chlorophyll and is preferably used for maturation.

Such a bullet-shape LED lamp 40 is attached to a position where it is difficult to attach the substrate-shape LED light source 10, which is constituted by the ceramic substrate 1 and the blue LED chip 2 provided on the ceramic substrate 1 (described in Embodiment 1). Note, however, that there are not so many places where it is difficult to attach the It is clear from Table 1 that the substrate-type LED light source 10 of Embodiment 1 and the bullet-shape LED lamp 40 of Embodiment 2 are superior to the combination of the conventional bullet-shape red LED lamp and the conventional bullet-shape blue LED lamp in terms of all of the following points: reliability, cost, characteristics, installation area and life.

Specifically, with regard to the installation area, assuming that a combination of a bullet-shape blue LED and a bullet-shape red LED (conventional technique) occupies an area of 1, the bullet-shape LED lamp 40 occupies an area of ⅓ and the substrate-type LED light source 10 and the illumination LED light source 20 each occupy an area of ⅙. That is, the substrate-type LED light source 10, the illumination LED light source 20 and the bullet-shape LED lamp 40 of the present embodiment are advantageous in that each of them occupies only a small area.

Further, with regard to costs, the substrate-type LED light source 10, the illumination LED light source 20 and the bullet-shape LED lamp 40 of the present embodiment are clearly more cost effective than the conventional techniques.

Furthermore, the substrate-type LED light source 10 and the illumination LED light source 20 last for 30,000 to 40,000 hours. It is needless to say that this is longer than the life of an electric lamp (bulb), and is also more than 10 times as much as the life of a fluorescent lamp.

As described above, the bullet-shape LED lamp 40 (LED light source for plant cultivation) of the present embodiment includes (i) a cathode lead frame 43, (ii) a mount lead cup 41 connected to the cathode lead frame 43, (iii) at least one blue LED chip 2 provided in the mount lead cup 41, (iv) an anode lead frame 42 connected, via a conductive wire 5, to the at least one blue LED chip 2 provided in the mount lead cup 41, (v) a resin layer 7 in which a red phosphor 7b is dispersed and with which the mount lead cup 41 is filled so that the at least one blue LED chip 2 is covered, and (vi) a sealing resin 44 which has a bullet shape and encloses the entire mount lead cup 41 such that an end of the cathode lead frame 43 and an end of the anode lead frame 42 are exposed.

This makes it possible to provide a bullet-shape LED lamp 40 having a so-called bullet shape. Since such a bullet-shape LED lamp 40 having a bullet shape occupies only a small area, the bullet-shape LED lamp 40 is suitable for spotlighting for plant cultivation.

[Embodiment 3]

The following description will discuss a further embodiment of the present invention with reference to FIG. 10. Note that configurations other than those described in the present embodiment are the same as those of Embodiments 1 and 2. For convenience of description, members having functions identical to those illustrated in the drawings of Embodiments 1 and 2 are assigned identical referential numerals, and their descriptions are omitted here.

The substrate-type LED light source 10 described in the foregoing Embodiment 1 and the bullet-shape LED lamp 40 described in the foregoing Embodiment 2 each include at least one blue LED chip which has an emission peak in a range from 400 nm to 480 nm so as to correspond to the blue light region absorption peak of chlorophyll.

On the other hand, an LED light source for plant cultivation of the present embodiment is different from those of Embodiments 1 and 2 in that the blue LED chip is constituted by (i) at least one blue LED chip for chlorophyll a which has an emission peak in a range from 400 nm to 450 nm so as to correspond to a blue light region absorption peak of chlorophyll a and (ii) at least one blue LED chip for chlorophyll b which has an emission peak in a range from 400 nm to 480 nm so as to correspond to a blue light region absorption peak of chlorophyll b.

Specifically, a substrate-type LED light source (LED light source for plant cultivation) 50 of the present embodiment is constituted by (i) a ceramic substrate (substrate) 1, (ii) a plurality of blue LED chips 2 and a plurality of blue LED chips 52 provided on the ceramic substrate 1, and (iii) a standing wall 3 which is made of resin and surrounds the blue LED chips 2 and 52 (see (a) of FIG. 10).

As illustrated in (b) of FIG. 10, in a space inside the standing wall 3, each of the blue LED chips 2 and the blue LED chips 52 is connected, via conductive wires 5, to a wire pattern 4a and a wire pattern 4b, respectively, provided on both sides of a column to which that LED chip belongs. The wire pattern 4a and the wire pattern 4b are connected to a cathode land 6a and an anode land 6b, respectively, which are provided on the ceramic substrate 1 but outside the standing wall 3.

In the space inside the standing wall 3, there is provided a resin layer 7 which covers the blue LED chips 2 and the blue LED chips 52 (see (a) of FIG. 10). The resin layer 7 is made up of (i) a resin 7a which fills the space and (ii) a red phosphor 7b mixed and dispersed in the resin 7a.

Each of the blue LED chips 2 of the present embodiment emits blue light (first light) having a wavelength of 400 nm to 480 nm (long wavelengths in the blue light region), which light corresponds to the blue light region absorption peak of chlorophyll b. That is, each of the blue LED chips 2 for the long wavelengths in the blue light region serves as a blue LED chip for chlorophyll b of the present invention.

On the other hand, each of the blue LED chips 52 of the present embodiment emits blue light (first light) having a wavelength of 400 nm to 450 nm (short wavelengths in the blue light region), which light corresponds to the blue light region absorption peak of chlorophyll a. That is, each of the blue LED chips 52 for the short wavelengths in the blue light region serves as a blue LED chip for chlorophyll a of the present invention.

Further, the red phosphor 7b is one that emits, upon absorbing the light from the blue LED chips 2 and the light from the blue LED chips 52, second light having a peak wavelength in a range from 620 nm to 700 nm corresponding to the red light region absorption peaks of chlorophyll a and chlorophyll b.

Specifically, plants contain chlorophyll a and chlorophyll b. The chlorophyll a and chlorophyll b have respective different light absorption characteristics in the blue light region. More specifically, as shown in FIG. 5 described in the foregoing Embodiment 1, chlorophyll a has an absorption peak at 400 nm to 450 nm in the blue light region, whereas chlorophyll b has an absorption peak at 400 nm to 480 nm in the blue light region.

In view of this, the substrate-type LED light source 50 (LED light source for plant cultivation) of the present embodiment is configured such that the at least one blue LED chip is constituted by (i) at least one blue LED chip 52 (blue LED chip for chlorophyll a) for the short wavelengths in the blue light region, which has an emission peak in a range from 400 nm to 450 nm so as to correspond to a blue light region absorption peak of chlorophyll a and (ii) at least one blue LED chip 2 (blue LED chip for chlorophyll b) for the long wavelengths in the blue light region, which has an emission peak in a range from 400 nm to 480 nm so as to correspond to a blue light region absorption peak of chlorophyll b.

This makes it possible to provide an LED light source for plant cultivation which is more suitable for a plant containing chlorophyll a and chlorophyll b.

The foregoing description discussed the substrate-type LED light source 50 (LED light source for plant cultivation) which is partly different in configuration from the substrate-type LED light source 10. Note, however, that the LED light source for plant cultivation of the present invention is not limited to this configuration. A bullet-shape LED lamp partly different in configuration from the bullet-shape LED lamp 40 described in Embodiment 2 is also encompassed in the present invention.

[Embodiment 4]

The following description will discuss still a further embodiment of the present invention. Note that configurations other than those described in the present embodiment are the same as those of Embodiments 1 to 3. For convenience of description, members having functions identical to those illustrated in the drawings of Embodiments 1 to 3 are assigned identical referential numerals, and their descriptions are omitted here.

The foregoing Embodiments 1 to 3 discussed LED light sources for plant cultivation intended for plants which require light for photosynthesis to grow. Note, however, that a light emitting device of the present invention can be used not only for plants but also for algae which require light for photosynthesis to grow. In view of this, the present embodiment discusses an application of the light emitting device to photosynthetic algae.

Specifically, examples of plant pigments, other than chlorophyll a and chlorophyll b which carry out photosynthesis, include: chlorophyll pigments such as chlorophyll c and bacteriochlorophyll a (835 nm); carotenoid pigments such as beta-carotene (446 nm), lutein and fucoxanthin (453 nm); and phycobilin pigments such as phycocyanin (612 nm) and phycoerythrin (540 nm). Note that the numbers in parentheses are wavelengths of absorption peaks. As described above, bacteriochlorophyll has an absorption peak in a range not less than 800 nm.

Note here that, specifically, various algae have the following pigments.

First, main pigments of diatoms are chlorophyll a and fucoxanthin (453 nm). As described earlier, the chlorophyll a has an absorption peak in a range from 400 nm to 450 nm in a blue light region and an absorption peak in a range from 650 nm to 660 nm in a red light region.

Therefore, in this case, a light emitting device preferably (i) includes: at least one blue LED chip (at least one first LED chip) which emits first short-wavelength-region light corresponding to a first peak wavelength (453 nm) of fucoxanthin, which first peak wavelength is one, of a plurality of peak wavelengths of light absorbed by a diatom which requires the light for photosynthesis to grow, which is in a relatively short wavelength region; and a phosphor-containing sealing resin which covers the at least one blue LED chip, and (ii) is configured such that a red phosphor (phosphor) contained in the phosphor-containing sealing resin emits long-wavelength-region light corresponding to a peak wavelength (650 nm to 660 nm) of the chlorophyll a upon absorbing the first short-wavelength-region light emitted from the at least one blue LED chip, which peak wavelength is one, of the plurality of peak wavelengths, which is in a longer wavelength region than the first peak wavelength (453 nm). This makes it possible to stimulate the growth of diatoms.

Furthermore, in the case of diatoms, the light emitting device can further include at least one second LED chip which emits second short-wavelength-region light corresponding to a second peak wavelength (400 nm to 450 nm) of chlorophyll a, which second peak wavelength is one, of the plurality of peak wavelengths, which is in the relatively short wavelength region but is a different wavelength from the first peak wavelength (453 nm) of fucoxanthin. This makes it possible to further stimulate the growth of diatoms.

Next, main pigments of green algae are chlorophyll a, chlorophyll b and beta-carotene (446 nm). As described earlier, the chlorophyll a has an absorption peak in a range from 400 nm to 450 nm in the blue light region and an absorption peak in a range from 650 nm to 660 nm in the red light region, whereas chlorophyll b has an absorption peak in a range from 400 nm to 480 nm in the blue light region and an absorption peak in a range from 620 nm to 630 nm in the red light region.

Therefore, in this case, a light emitting device preferably (i) includes: at least one blue LED chip (at least one first LED chip) which emits first short-wavelength-region light corresponding to a first peak wavelength (446 nm) of beta-carotene, which first peak wavelength is one, of a plurality of peak wavelengths of light absorbed by a green alga which requires the light for photosynthesis to grow, which is in a relatively short wavelength region; and a phosphor-containing sealing resin which covers the at least one blue LED chip, and (ii) is configured such that a red phosphor (phosphor) contained in the phosphor-containing sealing resin emits long-wavelength-region light corresponding to a peak wavelength (650 nm to 660 nm) of the chlorophyll a and a peak wavelength (620 nm to 630 nm) of the chlorophyll b upon absorbing the first short-wavelength-region light emitted from the at least one blue LED chip, which peak wavelength are ones, of the plurality of peak wavelengths, which are in a longer wavelength region than the first peak wavelength (446 nm). This makes it possible to stimulate the growth of green algae.

Next, main pigments of blue-green algae are chlorophyll a and phycocyanin (612 nm). As described earlier, the chlorophyll a has an absorption peak in a range from 400 nm to 450 nm in the blue light region.

Therefore, in this case, a light emitting device preferably (i) includes: at least one blue LED chip (at least one first LED chip) which emits first short-wavelength-region light corresponding to a first peak wavelength (400 nm to 450 nm) of chlorophyll a, which first peak wavelength is one, of plurality of peak wavelengths of light absorbed by a blue-green alga which requires the light for photosynthesis to grow, which is in a relatively short wavelength region; and a phosphor-containing sealing resin which covers the at least one blue LED chip, and (ii) is configured such that a red phosphor (phosphor) contained in the phosphor-containing sealing resin emits long-wavelength-region light corresponding to a peak wavelength (612 nm) of the phycocyanin upon absorbing the first short-wavelength-region light emitted from the at least one blue LED chip, which peak wavelength is one, of the plurality of peak wavelengths, which is in a longer wavelength region than the first peak wavelength (400 nm to 450 nm). This makes it possible to stimulate the growth of blue-green algae.

In this case, the light emitting device can include a blue LED chip having a wavelength that corresponds to an absorption peak wavelength of the red phosphor.

Specifically, first, the light emitting device (i) includes: at least one blue LED chip (at least one first LED chip) which emits first short-wavelength-region light corresponding to the first peak wavelength (400 nm to 450 nm) of chlorophyll a, which first peak wavelength is in a relatively short wavelength region; and a phosphor-containing sealing resin which covers the at least blue LED chip, and (ii) is configured such that a first red phosphor (phosphor) contained in the phosphor-containing sealing resin emits long-wavelength-region light corresponding to a peak wavelength (650 nm to 660 nm) of the chlorophyll a upon absorbing the first short-wavelength-region light emitted from the at least one blue LED chip, which peak wavelength is one, of the plurality of peak wavelengths, which is in a longer wavelength region than the first peak wavelength (400 nm to 450 nm).

Next, the light emitting device is provided with at least one second blue LED chip (at least one second LED chip) which emits second short-wavelength-region light corresponding to a second peak wavelength which is in the relatively short wavelength region but is a different wavelength from the first peak wavelength (400 nm to 450 nm) of chlorophyll a.

The light emitting device is configured such that a second red phosphor (phosphor) contained in the phosphor-containing sealing resin, which second red phosphor corresponds to the at least one second blue LED chip, is one that emits, upon absorbing first short-wavelength-region light emitted from the at least one second blue LED chip, long-wavelength-region light corresponding to a peak wavelength (612 nm) of phycocyanin. The peak wavelength (612 nm) is one, of the plurality of peak wavelengths, which is in the longer wavelength region than the first peak wavelength (400 nm to 450 nm).

This achieves the following. That is, even if the first red phosphor corresponding to the at least one first blue LED chip which emits the first short-wavelength-region light is not capable of emitting the long-wavelength-region light which is in the relatively long wavelength region and corresponds to the peak wavelength (612 nm) of phycocyanin, the second red phosphor allows for emission of the long-wavelength-region light corresponding to the peak wavelength (612 nm) of phycocyanin by use of the at least one second blue LED chip which emits the second short-wavelength-region light.

As a result, the light emitting device emits more intense red-wavelength-region light to phycocyanin, and in turn achieves good growth of blue-green algae.

It should be noted that such a method is applicable not only to cultivation of blue-green algae, but also to cultivation and incubation of other plants.

With use of such a light emitting device, it is possible to stimulate the growth of algae such as diatoms, green algae and blue-green algae by irradiating the algae such as diatoms, green algae and blue-green algae by the light emitting device.

Furthermore, the light emitting device does not require the use of two types of LED chips (separately provided blue LED chip and red LED chip) to emit light corresponding to the blue light region absorption peak and the red light region absorption peak of chlorophyll etc. which light is necessary for the growth of plants such as algae, and is capable of emitting such light with use of only one type of LED chip (blue LED chip). Therefore, the light emitting device does not occupy a large area. Moreover, in this configuration, since the red phosphor is to be dispersed in the resin layer, it is possible to disperse the red phosphor in the resin at a predetermined blending ratio. By changing the blending ratio, it is possible to change the amount of light in a blue light region and the amount of light in a red light region.

Accordingly, it is possible to provide a light emitting device capable of, despite only having a simple configuration and occupying a small area, (i) easily adjusting the proportions of light in the blue light region and light in the red light region and (ii) emitting blue light and red light mixed with little spatial color unevenness.

Furthermore, the light emitting device of the present embodiment can further include at least one second LED chip which emits second short-wavelength-region light corresponding to a second peak wavelength, which is in the relatively short wavelength region but is a different wavelength from the first peak wavelength, of the plurality of peak wavelengths.

This makes it possible to provide a light emitting device which appropriately stimulates the growth of organisms such as algae even in a case where there are the following two peak wavelengths in the relatively short wavelength region: the first peak wavelength and the second peak wavelength.

The present invention is not limited to the descriptions of the respective embodiments, but may be altered within the scope of the claims. An embodiment derived from a proper combination of technical means disclosed in different embodiments is encompassed in the technical scope of the invention.

As has been described, the LED light source for plant cultivation of the present invention can be configured such that said at least one blue LED chip is constituted by: at least one blue LED chip for chlorophyll a, which blue LED chip has an emission peak in a range from 400 nm to 450 nm so as to correspond to a blue light region absorption peak of the chlorophyll a; and at least one blue LED chip for chlorophyll b, which blue LED chip has an emission peak in a range from 400 nm to 480 nm so as to correspond to a blue light region absorption peak of the chlorophyll b.

Specifically, plants contain chlorophyll a and chlorophyll b. The chlorophyll a and chlorophyll b have respective different light absorption characteristics in the blue light region. More specifically, chlorophyll a has an absorption peak at 400 nm to 450 nm in the blue light region, whereas chlorophyll b has an absorption peak at 400 nm to 480 nm in the blue light region.

In view of this, the LED light source for plant cultivation of the present invention includes, in order to correspond to two light absorption characteristics of chlorophyll a and chlorophyll b in the blue light region, (i) the at least one blue LED chip for chlorophyll a which has an emission peak in a range from 400 nm to 450 nm so as to correspond to the blue light region absorption peak of chlorophyll a and (ii) the at least one blue LED chip for chlorophyll b which has an emission peak in a range from 400 nm to 480 nm so as to correspond to the blue light region absorption peak of chlorophyll b.

This makes it possible to provide an LED light source for plant cultivation which is more suitable for a plant containing chlorophyll a and chlorophyll b.

The LED light source for plant cultivation of the present invention is preferably configured such that a ratio of a photosynthetic photon flux in a red light region of 620 nm to 700 nm to a photosynthetic photon flux in a blue light region of 400 nm to 480 nm falls within a range from 1.3:1 to 10:1. It should be noted that the photosynthetic photon flux is a value obtained by multiplying the photosynthetic photon flux density (PPFD) by the area that receives light. Note here that, in a case where a substance is irradiated with sunlight, the photon flux density is a value obtained by dividing, by the area of the surface of the substance, the number of photons with which the surface is irradiated per second.

The "photon flux density" is expressed generally in terms of the number of photons. Therefore, the number is the same both in the case of infrared light and in the case of ultraviolet light. However, a photochemical reaction occurs only when photons that a pigment can absorb are received. For example, receiving light that chlorophyll cannot absorb means nothing to plants. In view of this, in the field of photosynthesis, there are definitions of "photosynthetic photon flux density" and "photosynthetic photon flux" only for a wavelength range of 400 nm to 700 nm that chlorophyll absorbs.

In view of the circumstances, the LED light source for plant cultivation of the present invention is configured such that the ratio of the photosynthetic photon flux in the red light region of 620 nm to 700 nm to the photosynthetic photon flux in the blue light region of 400 nm to 480 nm falls within a range from 1.3:1 to 10:1. This makes it possible to provide an LED light source for plant cultivation which is suitable for germination, nursery and maturation of plants.

The LED light source for plant cultivation of the present invention is preferably configured such that a blending ratio of the red phosphor in the resin layer to a resin in the resin layer falls within a range from 0.05:1: to 0.20:1. This makes it possible to provide an LED light source for plant cultivation which is suitable for germination, nursery and maturation of plants.

The LED light source for plant cultivation of the present invention is preferably configured such that, in a case where the LED light source is to be provided to a germination shelf or a nursery shelf, a blending ratio of the red phosphor in the resin layer to a resin in the resin layer falls within a range from 0.05:1 to 0.10:1.

Specifically, chlorophyll (chlorophyll), which plays a dominant role in plants' photosynthesis, does not absorb light in a uniform manner; it shows clear absorption peaks at around 660 nm (red) and around 450 nm (blue). In association with this, the wavelength characteristics required for photosynthesis show a second peak at around 660 nm and a first peak at around 450 nm. That is, in a maturation stage in which plants have leaves and carry out photosynthesis actively, light having both blue light component and red light component is effective for growth. Meanwhile, blue light having a wavelength of around 450 nm also has influence on photosystems of plants called high-energy reaction systems, and thus is essential for normal morphogenesis of plants. Therefore, in the stages of germination and nursery, the blue light component is especially important.

In this regard, according to the present invention, the blending ratio of the red phosphor in the resin layer to the resin in the resin layer falls within a range from 0.05:1 to 0.10:1. Such a ratio makes it possible to provide an LED light source for plant cultivation which easily emits blue light component that is essential for normal morphogenesis of plants in the stages of germination and nursery.

The LED light source for plant cultivation of the present invention is preferably configured such that, in a case where the LED light source is to be provided to a maturation shelf, a blending ratio of the red phosphor in the resin layer to a resin in the resin layer falls within a range from 0.15:1 to 0.20:1.

This makes it possible to provide an LED light source for plant cultivation capable of easily emitting light having both blue light component and red light component, in the maturation stage in which plants have leaves and carry out photosynthesis actively.

The LED light source for plant cultivation of the present invention is preferably configured such that, in a case where the LED light source is to be provided to a germination shelf or a nursery shelf, a ratio of a photosynthetic photon flux in a red light region of 620 nm to 700 nm to a photosynthetic photon flux in a blue light region of 400 nm to 480 nm falls within a range from 1.3:1 to 3.5:1.

This makes it possible to provide an LED light source for plant cultivation suitable for germination and nursery of plants.

The LED light source for plant cultivation of the present invention is preferably configured such that, in a case where the LED light source is to be provided to a maturation shelf, a ratio of a photosynthetic photon flux in a red light region of 620 nm to 700 nm to a photosynthetic photon flux in a blue light region of 400 nm to 480 nm falls within a range from 7.5:1 to 10:1.

This makes it possible to provide an LED light source for plant cultivation suitable for maturation of plants.

The LED light source for plant cultivation of the present invention is preferably configured such that, for cultivation of a plant containing more chlorophyll a than chlorophyll b, the red phosphor contains a $CaAlSiN_3$:Eu component.

Specifically, plants contain chlorophyll a and chlorophyll b. The chlorophyll a and chlorophyll b have respective different light absorption characteristics. More specifically, chlorophyll a has an absorption peak at 650 nm to 660 nm in the red light region, whereas chlorophyll b has an absorption peak at 620 nm to 630 nm in the red light region.

In view of the circumstances, the LED light source for plant cultivation of the present invention is configured such that, for cultivation of a plant containing more chlorophyll a than chlorophyll b, the red phosphor contains a $CaAlSiN_3$:Eu component. That is, the red phosphor containing a $CaAlSiN_3$:Eu component is capable of emitting light having a peak wavelength in a range from 650 nm to 660 nm.

Therefore, for cultivation of a plant containing more chlorophyll a than chlorophyll b, it is preferable to use a red phosphor containing a $CaAlSiN_3$:Eu component.

The LED light source for plant cultivation of the present invention is preferably configured such that, for cultivation of a plant containing more chlorophyll b than chlorophyll a, the red phosphor contains a $(Sr,Ca)AlSiN_3$:Eu component.

That is, chlorophyll b has an absorption peak at 620 nm to 630 nm in the red light region, and a red phosphor containing a $(Sr,Ca)AlSiN_3$:Eu component is capable of emitting light having a peak wavelength in a range from 620 nm to 630 nm.

Therefore, for cultivation of a plant containing more chlorophyll b than chlorophyll a, it is preferable to use a red phosphor containing a $(Sr,Ca)AlSiN_3$:Eu component.

The LED light source for plant cultivation of the present invention can be configured such that: a plurality of blue LED chips are provided on a substrate, and a standing wall is provided around the plurality of blue LED chips; and a space inside the standing wall is filled with a resin in which the red phosphor is dispersed.

This makes it possible to provide a so-called substrate-type LED light source for plant cultivation. Since this configuration is such that a plurality of blue LED chips are included in a single LED light source for plant cultivation, it is possible to emit a large amount of light with use of only a single LED light source for plant cultivation. Furthermore, since a red phosphor dispersed in a resin is used instead of a red LED chip, it is possible to considerably reduce the installation area for a plurality of red LED chips corresponding to the plurality of blue LED chips.

Accordingly, it is possible to emit a large amount of light with use of a single LED light source for plant cultivation whose installation area is small.

The LED light source for plant cultivation of the present invention can include: a cathode lead; a cup connected with the cathode lead; said at least one blue LED chip provided in the cup; an anode lead connected, via a conductive wire, with said at least one blue LED which is provided in the cup; a resin layer in which the red phosphor is dispersed and with which the cup is filled so that said at least one blue LED chip is covered; and a sealing resin which has a bullet shape and encloses the entire cup such that an end of the cathode lead and an end of the anode lead are exposed.

This makes it possible to provide a so-called bullet-shape LED light source for plant cultivation. Such a bullet-shape LED light source for plant cultivation occupies only a small area, and thus is suitable for spotlighting for plant cultivation.

The LED light source for plant cultivation of the present invention is configured to emit first light having a wavelength of 400 nm to 480 nm and second light having a wavelength of 620 nm to 700 nm.

This makes it possible to produce both blue and red peaks necessary for the growth of plants, with use of a single LED light source for plant cultivation. Since a single LED light source for plant cultivation is capable of producing both peaks, the LED light source for plant cultivation occupies a smaller area, is more dependable and is more suitable for use in plant factories etc.

The LED light source for plant cultivation of the present invention is configured to emit (i) first light from said at least one blue LED chip and (ii) second light that the red phosphor emits upon excitation by said at least one blue LED chip.

Specifically, since the red phosphor is dispersed in the resin which covers the blue LED chip(s), part of the first light emitted from the blue LED chip(s) is absorbed by the red phosphor and converted into the second light by the red phosphor whereas the other is scattered by the red phosphor. Since each particle of the red phosphor serves as a point light source, blue light or red light is emitted in a uniform manner.

This makes it possible to produce both blue and red peaks necessary for the growth of plants, with use of a single LED light source for plant cultivation. Since a single LED light source for plant cultivation is capable of producing both peaks, the LED light source for plant cultivation occupies a smaller area, is more dependable and is more suitable for use in plant factories etc.

The LED light source for plant cultivation of the present invention is preferably configured such that cooling means is provided on a back surface of the substrate.

This makes it possible to cool the blue LED chip(s) whose temperature has increased.

INDUSTRIAL APPLICABILITY

The present invention is applicable to a light emitting device which emits light to be absorbed by plants or algae which require the light for photosynthesis to grow, and an LED light source for plant cultivation and a plant factory.

REFERENCE SIGNS LIST

1 Ceramic substrate (substrate)
2 Blue LED chip (blue LED chip for chlorophyll b, first LED chip)
3 Standing wall
7 Resin layer (phosphor-containing sealing resin)
7a Resin
7b Red phosphor (phosphor)
7c Green phosphor
10 Substrate-type LED light source (LED light source for plant cultivation)
10A Substrate-type LED light source (LED light source for plant cultivation)
10B Substrate-type LED light source (LED light source for plant cultivation)
10C Substrate-type LED light source (LED light source for plant cultivation)
10D Substrate-type LED light source (LED light source for plant cultivation)
20 Illumination LED light source
30 Plant factory
40 Bullet-shape LED lamp (LED light source for plant cultivation)
40A Bullet-shape LED lamp (LED light source for plant cultivation)
40D Bullet-shape LED lamp (LED light source for plant cultivation)
41 Mount lead cup (cup)
42 Anode lead frame (anode lead)
43 Cathode lead frame (cathode lead)
44 Sealing resin
50 Substrate-type LED light source (LED light source for plant cultivation)
52 Blue LED chip (blue LED chip for chlorophyll a)

The invention claimed is:
1. An LED light source for plant cultivation including a light emitting device, said light emitting device comprising:
at least one first LED chip which emits first short-wavelength-region light corresponding to a first peak wavelength, which is in a relatively short wavelength region, of a plurality of peak wavelengths of light absorbed by a plant or an alga which requires the light for photosynthesis to grow;
a phosphor-containing sealing resin which covers said at least one first LED chip,
a phosphor contained in the phosphor-containing sealing resin emitting long-wavelength-region light upon absorbing the first short-wavelength-region light emitted from said at least one first LED chip, the long-wavelength-region light corresponding to a peak wavelength, which is in a longer wavelength region than the first peak wavelength, of the plurality of peak wavelengths,
said LED light source for plant cultivation comprising:
at least two blue LED chips having an emission peak corresponding to a blue light region absorption peak of chlorophyll;
at least one red phosphor which emits, upon receiving excitation light from said at least two blue LED chips, light having a peak wavelength in a range from 620 nm to 700 nm so as to correspond to a red light region absorption peak of chlorophyll, and a green phosphor which emits light upon receiving excitation light from said at least two blue LED chips; and
a resin layer in which the red phosphor and the green phosphor are dispersed and which covers said at least two blue LED chips,
wherein said at least two blue LED chips are constituted by:
at least one blue LED chip for chlorophyll a which blue LED chip has an emission peak in a range from 400 nm to 450 nm so as to correspond to a blue light region absorption peak of the chlorophyll a; and
at least one blue LED chip for chlorophyll b which blue LED chip has an emission peak in a range from 450 nm to 480 nm so as to correspond to a blue light region absorption peak of the chlorophyll b;
wherein a combination of said at least two blue LED chips, said at least one red phosphor which emits light upon receiving excitation light from said at least two blue LED chips, and the green phosphor which emits light upon receiving excitation light from said at least two blue LED chips brings about a ratio of a photosynthetic photon flux in a red light region of 620 nm to 700 nm to a photosynthetic photon flux in a blue light region of 400 nm to 480 nm falling within a range from 1.3:1 to 10:1,
wherein said at least two blue LED chips are provided on a ceramic substrate having a quadrilateral shape, and a standing wall made of resin is provided around said at least two blue LED chips,
the ceramic substrate has a non-sealed area outside the standing wall, the non-sealed area being not covered with a sealing resin,
a cathode land and an anode land are provided in the non-sealed area and are connected with respective wire patterns each of which wire patterns is connected to any of said at least two blue LED chips, the cathode land and the anode land are provided at respective two corners of the ceramic substrate so as to be diagonally located relative to each other, and a space inside the standing wall is filled with the resin layer, and wherein a difference in wavelength between the emission peak of the blue LED chip for chlorophyll a and the emission peak of the blue LED chip for chlorophyll b is 10 to 30 nm.

2. The LED light source for plant cultivation according to claim 1, wherein a blending ratio of the red phosphor in the resin layer to a resin in the resin layer falls within a range from 0.05:1 to 0.20:1.

3. The LED light source for plant cultivation according to claim 1, wherein, in a case where the LED light source is to be provided to a germination shelf or a nursery shelf, a blending ratio of the red phosphor in the resin layer to a resin in the resin layer falls within a range from 0.05:1 to 0.10:1.

4. The LED light source for plant cultivation according to claim 1, wherein, in a case where the LED light source is to be provided to a maturation shelf, a blending ratio of the red phosphor in the resin layer to a resin in the resin layer falls within a range from 0.15:1 to 0.20:1.

5. The LED light source for plant cultivation according to claim 1, wherein, in a case where the LED light source is to be provided to a germination shelf or a nursery shelf, a ratio of a photosynthetic photon flux in a red light region of 620 nm to 700 nm to a photosynthetic photon flux in a blue light region of 400 nm to 480 nm falls within a range from 1.3:1 to 3.5:1.

6. The LED light source for plant cultivation according to claim 1, wherein, in a case where the LED light source is to be provided to a maturation shelf, a ratio of a photosynthetic photon flux in a red light region of 620 nm to 700 nm to a photosynthetic photon flux in a blue light region of 400 nm to 480 nm falls within a range from 7.5:1: to 10:1.

7. The LED light source for plant cultivation according to claim 1, wherein, for cultivation of a plant containing more chlorophyll a than chlorophyll b, the red phosphor contains a $CaAlSiN_3$:Eu component, and wherein, for cultivation of a plant containing more chlorophyll b than chlorophyll a, the red phosphor contains a $(Sr, Ca)AlSiN_3$:Eu component.

8. The LED light source for plant cultivation according to claim 1, which emits first light having a wavelength of 400 nm to 480 nm and second light having a wavelength of 620 nm to 700 nm.

9. The LED light source for plant cultivation according to claim 1, which emits (i) first light from said at least two blue LED chips, (ii) second light that the red phosphor emits upon excitation by said at least two blue LED chips, and (iii) third light that the green phosphor emits upon excitation by said at least two blue LED chips.

10. The LED light source for plant cultivation according to claim 1, wherein cooling means is provided on a back surface of the substrate.

11. A method of operating an LED light source for plant cultivation including a light emitting device, said method comprising:

having at least one first LED chip emitting first short-wavelength-region light corresponding to a first peak wavelength, which is in a relatively short wavelength region, of a plurality of peak wavelengths of light absorbed by a plant or an alga which requires the light for photosynthesis to grow;

having a phosphor-containing sealing resin which covers said at least one first LED chip, having a phosphor contained in the phosphor-containing sealing resin emitting long-wavelength-region light upon absorbing the first short-wavelength-region light emitted from said at least one first LED chip, the long-wavelength-region light corresponding to a peak wavelength, which is in a longer wavelength region than the first peak wavelength, of the plurality of peak wavelengths, having said LED light source for plant cultivation comprising:

at least two blue LED chips having an emission peak corresponding to a blue light region absorption peak of chlorophyll;

at least one red phosphor emitting, upon receiving excitation light from said at least two blue LED chips, light having a peak wavelength in a range from 620 nm to 700 nm so as to correspond to a red light region absorption peak of chlorophyll, and a green phosphor emitting light upon receiving excitation light from said at least two blue LED chips; and a resin layer in which the red phosphor and the green phosphor are dispersed and which covers said at least two blue LED chips, wherein said at least two blue LED chips are constituted by:

at least one blue LED chip for chlorophyll a which blue LED chip has an emission peak in a range from 400 nm to 450 nm so as to correspond to a blue light region absorption peak of the chlorophyll a; and at least one blue LED chip for chlorophyll b which blue LED chip has an emission peak in a range from 450 nm to 480 nm so as to correspond to a blue light region absorption peak of the chlorophyll b;

wherein a combination of said at least two blue LED chips, said at least one red phosphor which emits light upon receiving excitation light from said at least two blue LED chips, and the green phosphor which emits light upon receiving excitation light from said at least two blue LED chips brings about a ratio of a photosynthetic photon flux in a red light region of 620 nm to 700 nm to a photosynthetic photon flux in a blue light region of 400 nm to 480 nm falling within a range from 1.3:1 to 10:1, wherein said at least two blue LED chips are provided on a ceramic substrate having a quadrilateral shape, and a standing wall made of resin is provided around said at least two blue LED chips, the ceramic substrate has a non-sealed area outside the standing wall, the non-sealed area being not covered with a sealing resin, a cathode land and an anode land are provided in the non-sealed area and are connected with respective wire patterns each of which wire patterns is connected to any of said at least two blue LED chips, the cathode land and the anode land are provided at respective two corners of the ceramic substrate so as to be diagonally located relative to each other, and a space inside the standing wall is filled with the resin layer, and wherein in emitting light a difference in wavelength between the emission peak of the blue LED chip for chlorophyll a and the emission peak of the blue LED chip for chlorophyll b is 10 to 30 nm.

* * * * *